United States Patent [19]
Kitabayashi et al.

[11] Patent Number: 5,777,422
[45] Date of Patent: Jul. 7, 1998

[54] DIAMOND-ZNO SURFACE ACOUSTIC WAVE DEVICE HAVING RELATIVELY THINNER ZNO PIEZOELECTRIC LAYER

[75] Inventors: Hiroyuki Kitabayashi; Hideaki Nakahata; Kenjiro Higaki; Satoshi Fujii; Shin-ichi Shikata, all of Itami, Japan

[73] Assignee: Sumitomo Electric Industries, Ltd., Japan

[21] Appl. No.: 720,369

[22] Filed: Sep. 27, 1996

[30] Foreign Application Priority Data

Sep. 29, 1995 [JP] Japan .................... 7-276260

[51] Int. Cl.⁶ .................................. H01L 41/08
[52] U.S. Cl. ............................ 310/313 A; 310/313 R
[58] Field of Search ..................... 310/313 R, 313 A, 310/313 B, 313 D; 333/150–155, 193–196

[56] References Cited

U.S. PATENT DOCUMENTS

| | | | |
|---|---|---|---|
| 4,952,832 | 8/1990 | Imai et al. | 310/313 A |
| 5,160,869 | 11/1992 | Nakahata et al. | 310/313 A |
| 5,294,858 | 3/1994 | Nakahata et al. | 310/313 A |
| 5,401,544 | 3/1995 | Nakahata et al. | 310/313 R X |
| 5,426,340 | 6/1995 | Higaki et al. | 310/313 R |
| 5,446,329 | 8/1995 | Nakahata et al. | 310/313 A |
| 5,565,724 | 10/1996 | Hachigo et al. | 310/313 A |

*Primary Examiner*—Mark O. Budd
*Attorney, Agent, or Firm*—Pennie & Edmonds LLP

[57] ABSTRACT

The present invention directed to a SAW device comprising a diamond layer thinner ZnO layer, which can be operated at higher frequency, with superior characteristics including less energy loss. The first SAW device according to the present invention comprises a layer constitution shown in FIG. 23, wherein, for 0th mode surface acoustic wave having a wavelength $\lambda$, a parameter $kh3 = (2\pi/\lambda)t3$ satisfies: $0.0470 \leq kh3 \leq 0.0625$, and wherein a parameter $kh1 = (2\pi/\lambda)t1$ and a parameter $kh2 = (2\pi/\lambda)t2$ are given within a region A-B-C-D-E-F-A in a two-dimensional Cartesian coordinate graph having ordinate axis of the $kh1$ and abscissa axis of $kh2$, the outer edge of the region A-B-C-D-E-F-A being given by a closed chain in the Cartesian coordinate, consisting of points A, B, C, D, E, and F, and lines A–B, B–C, C–D, D–E, E–F and F–A, as shown in a two-dimensional Cartesian coordinate graph of FIG. 3.

4 Claims, 25 Drawing Sheets

0TH MODE

1ST MODE

0TH MODE : $0.0470 \leq kh3 \leq 0.0625$

OTH MODE : 0.0625 ≦ kh3 ≦ 0.0780

1ST MODE : $0.0470 \leq kh3 \leq 0.0625$

1ST MODE : $0.0625 \leq kh3 \leq 0.0780$

V IN 0TH MODE

TCF IN 0TH MODE

V IN 1ST MODE

TCF IN 1ST MODE

V IN 0TH MODE : kh3=0.047

TCF IN 0TH MODE : kh3=0.047

V IN 0TH MODE : kh3=0.0625

TCF IN 0TH MODE : kh3=0.0625

V IN 0TH MODE : kh3=0.078

TCF IN 0TH MODE : kh3=0.078

V IN 1ST MODE : kh3=0.047

TCF IN 1ST MODE : kh3=0.047

V IN 1ST MODE : kh3=0.0625

TCF IN 1ST MODE : kh3=0.0625

V IN 1ST MODE : kh3=0.078

TCF IN 1ST MODE : kh3=0.078

DIAMOND-ZNO SURFACE ACOUSTIC WAVE DEVICE HAVING RELATIVELY THINNER ZNO PIEZOELECTRIC LAYER

BACKGROUND OF THE INVENTION

1. Field of the Invention

The present invention relates to improved surface acoustic wave (SAW) devices which comprise ZnO and diamond. The SAW devices according to the present invention are applicable in operating at higher frequency.

2. Related Background Art

A surface acoustic wave device (SAW device) is a device which utilizes the acoustic wave propagation and the piezoelectricity on the surface of piezoelectric materials. The SAW device has excellent temperature stability, durability, and phase characteristics. Thus, there are certain demands in the field of the advanced communication technology for SAW devices such as band-pass filters of cellular phones. As shown in FIG. 25, SAW devices 10 typically comprises a pair of interdigital transducers(IDTs) on piezoelectric material for generating and detecting the surface acoustic wave. AC power applied to input IDT 14 is transformed at a surface of piezoelectric material 12 into mechanical energy, where a wave of condensation and rarefaction is created by an input IDT 14 having inter-digital shape or comb-like shape to form acoustic wave. The acoustic wave propagates through the surface of piezoelectric material to an output IDT 16, where the acoustic wave is transformed to electric energy which is, in turn, output to external elements.

The center frequency ($f_0$) of transmission band SAW device is given by the equation: $f_0 = V/\lambda_0$, where $\lambda_0$ is a wavelength of the acoustic wave determined by the width between the digits or "teeth" of an IDT, and V is a propagation velocity of the surface acoustic wave (SAW) through the surface of the piezoelectric material.

It is generally considered in the prior art that the manufacturing of SAW device capable of suitably operating at GHz band is difficult. In order to manufacture SAW devices having increased center frequency $f_0$, the width between the digits of IDT may be reduced to decrease $\lambda_0$, or V may increase. However, $\lambda_0$ is considerably difficult to be reduced due to the general limitation of microfabrication in photo-lithography techniques. Thus, increased V is generally required for the purpose of obtaining SAW devices capable of operating at GHz band.

The energy-transforming (piezoelectric) efficiency is also important for SAW device to be used for the advanced communication equipments. The effective coupling coefficient($K^2$) is an index to conversion efficiency of the converting of electrical energy into mechanical energy on the surface of the device. The preferable range of the effective coupling coefficient depends upon applications; for example, at least about 0.1% for narrow-band filter. The temperature coefficient for frequency (TCF) of the SAW device is preferable to be small as possible, because the smaller temperature dependency of the SAW device is desirable.

The propagation loss of the SAW device is also preferable to be small as possible, since smaller attenuation in propagation of surface acoustic wave is desirable.

Various theoretical and the experimental evaluation on surface acoustic wave properties of SAW devices are disclosed, for the purpose of providing SAW devices capable of operating at higher frequency by having higher propagation velocity and higher effective coupling coefficient.

FIG. 23 typically illustrate an example of a layer constitution of SAW device. In U.S. Pat. No. 5,446,329 to Nakahata et.al., disclosure of which is hereby incorporated by reference, propagation velocity V, effective coupling coefficient $K^2$ and temperature coefficient with frequency TCF have been improved, in particular by focusing first mode surface acoustic wave: for example, V of 8,000 to 10,000 (m/s), TCF of −10 to 10 (ppm/°C.) and $K^2$ of 0.7 to 1.7 (%) are achieved for the layer constitution of $SiO_2$/ZnO/diamond shown in FIG. 23. In such layer constitution, the ZnO is piezoelectric material, the $SiO_2$ is passivating layer for protecting both of the piezoelectric material and the IDT, and the IDT is formed of aluminum (Al), which is advantageous material in fabricating into desired dimension and shape.

In the SAW devices having a layer structure of $SiO_2$/ZnO/diamond such as the device shown in FIG. 23, $SiO_2$ layer, a temperature coefficient of which is inverse to that of ZnO, is formed to an appropriate thickness so that smaller temperature coefficient for frequency is achieved by compensating increase/decrease of temperature coefficient of ZnO with decrease/increase of that of $SiO_2$, respectively. Such SAW devices can have much thinner Al IDT than ZnO and $SiO_2$, when the device is operated at lower frequency on the order of several hundred MHz. That is, much thicker ZnO piezoelectric layer than Al IDT, for example ZnO layer having a thickness 10 times the thickness of Al IDT, can be included in SAW device, when the SAW device is operated at lower frequency on the order of several hundred MHz. Temperature coefficient and propagation velocity of such SAW device are not affected by temperature coefficient of relatively thinner Al IDT. Thus, temperature coefficient for frequency of Al IDT itself can be negligible when SAW devices for lower frequency is designed to have thicker ZnO and thinner Al IDT.

However, higher propagation velocity than the prior art SAW devices is required while temperature coefficient as low as the prior art SAW devices must be maintained, when SAW devices having layer structure of $SiO_2$/ZnO/diamond is designed to have pass-band characteristics of higher frequency of 2.5 GHz band or higher. In order to achieve higher propagation velocity, ZnO piezoelectric layer must be formed as thin as possible.

In addition, it is required to provide SAW devices having lower propagation loss than prior art devices.

Therefore, it is an object of the invention to further improve the propagation velocity V, the thermal coefficient for frequency TCF and propagation loss of the SAW device, which includes Al IDT/ZnO/$SiO_2$ formed on diamond layer, to provide SAW device having improved operation characteristics at the higher frequency with less energy loss.

More specifically, it is an object of the present invention to provide SAW devices for 0th mode surface acoustic wave, having V of 8,000 to 9,200 (m/s), TCF of −10 to 10 (ppm/°C.), and lower propagation loss than that of SAW devices of aforementioned U.S. Pat. No. 5,446,329 to Nakahata et.al.

In addition, it is another object of the present invention to provide SAW devices for 1st mode surface acoustic wave, having V of 9,000 to 12,800 (m/s), TCF of −10 to 10 (ppm/°C.), and lower propagation loss than that of SAW devices of aforementioned U.S. Pat. No. 5,446,329.

SUMMARY OF THE INVENTION

We have conducted considerable number of experiments for attempting to form SAW devices having thinner ZnO layer to achieve higher propagation velocity, and found that, when thickness of Al IDT is for example, ⅓–⅕, or slightly smaller, of the thickness of ZnO layer, the influences of Al IDT over the device characteristics of the SAW devices is not negligible. For example, when ZnO layer having a thickness of 3 to 5 times the thickness of Al IDT, is formed over the Al IDT, propagation velocity and TCF of the SAW device having such ZnO layer and Al IDT are affected by Al IDT. In such constitution of the SAW device, the surface of ZnO layer also has rugged part corresponding to underlying IDT, which considerably affects the propagation loss. Further, in such SAW device, thermal expansion and shrinkage of Al IDT affect entire characteristics of the device against temperature variation, because thermal expansion coefficient of Al is larger than that of ZnO.

We have further evaluated a number of experimental results for SAW devices which have thinner ZnO piezoelectric layer having a relatively small thickness t1 over wavelength λ, and we obtain successful results in optimizing the layer dimension and constitution of SAW device so that the SAW device can have desirable V and TCF.

We also obtain successful results in optimizing the layer dimension and constitution of SAW device so that the SAW device can have desirable V and TCF, taking the aforementioned influence of the thickness of IDT into consideration.

The first SAW device according to the present invention comprises: (i) a diamond layer, (ii) an aluminum (Al) interdigital transducer (IDT) formed on the diamond layer, the Al IDT having a thickness of t3, (iii) a polycrystalline c-axis oriented ZnO layer formed over the Al IDT and on the diamond layer, the ZnO layer having a thickness of t1, and (iv) a $SiO_2$ layer formed over the ZnO layer, the $SiO_2$ layer having a thickness of t2; wherein, for 0th mode surface acoustic wave having a wavelength λ, a parameter kh3=$(2\pi/\lambda)$t3 satisfies: $0.0470 \leq kh3 \leq 0.0625$, and wherein a parameter kh1=$(2\pi/\lambda)$t1 and a parameter kh2=$(2\pi/\lambda)$t2 are given within a region A-B-C-D-E-F-A in a two-dimensional Cartesian coordinate graph having ordinate axis of the kh1 and abscissa axis of kh2, the outer edge of the region A-B-C-D-E-F-A being given by a closed chain in the Cartesian coordinate, consisting of points A, B, C, D, E, and F, and lines A–B, B–C, C–D, D–E, E–F and F–A, the point A being given by a coordinate point (kh2=0.280, kh1=0.300); the point B being given by a coordinate point (kh2=0.200, kh1=0.221); the point C being given by a coordinate point (kh2=0.250, kh1=0.200); the point D being given by a coordinate point (kh2=0.570, kh1=0.200); the point E being given by a coordinate point (kh2=0.575, kh1=0.214); and the point F being given by a coordinate point (kh2=0.475, kh1=0.300).

The layer structure of this SAW device is schematically illustrated in FIG. 23, and the region A-B-C-D-E-F-A indicating the preferable combination of kh1 and kh2 is shown in a two-dimensional Cartesian coordinate graph of FIG. 3.

The first SAW device according to the present invention has the ZnO layer having the thickness of t1, where the parameter kh1=$(2\pi/\lambda)$t1 of not more than 0.3, which is much lower than the value of the same parameter kh1=$(2\pi/\lambda)$t1 of SAW devices disclosed in aforementioned U.S. Pat. No. 5,446,329 to Nakahata et.al. Further, the first SAW device according to the present invention has thinner ZnO layer relative to Al IDT, where thickness ratio of t1 (ZnO layer) to t3 (Al IDT):t1/t3 is 6.38 (=0.300/0.0470) at largest. Therefore, the SAW device is capable of being provided with higher propagation velocity V, lower temperature coefficient for frequency TCF, while achieving lower propagation loss.

The SAW device having above constitution is capable of being provided with propagation velocity V of from 8,000 to 9,200 (m/s) and temperature coefficient for frequency TCF of from −10 to 10 (ppm/°C.). The SAW device is also capable of being provided with propagation loss of 0.03 (dB/λ).

In order to compare the propagation loss of this SAW device for 0th mode SAW with that of SAW devices for 0th mode SAW disclosed in aforementioned U.S. Pat. No. 5,446,329 to Nakahata et.al., measurements of propagation loss of SAW devices according to U.S. Pat. No. 5,446,329 was carried out as a comparative example, details of which will be described later. In the comparative example, propagation loss of the SAW devices for 0th mode SAW, having layer constitution of FIG. 23, and having a constitution satisfying the relationship of kh1 (kh of ZnO) and kh2 (kh of $SiO_2$) "surrounded by 4 circles in FIG. 15" of U.S. Pat. No. 5,446,329 (14th column, lines 18 to 19), was obtained, and the obtained propagation loss was 0.051 to 0.053 (dB/λ), which was higher than that of the first SAW device according to the present invention.

The second SAW device according to the present invention comprises: (i) a diamond layer, (ii) an aluminum (Al) interdigital transducer (IDT) formed on the diamond layer, the Al IDT having a thickness of t3, (iii) a polycrystalline c-axis oriented ZnO layer formed over the Al IDT and on the diamond layer, the ZnO layer having a thickness of t1, and (iv) a $SiO_2$ layer formed over the ZnO layer, the $SiO_2$ layer having a thickness of t2; wherein, for 0th mode surface acoustic wave having a wavelength λ, a parameter kh3=$(2\pi/\lambda)$t3 satisfies: $0.0625 \leq kh3 \leq 0.0780$, and wherein a parameter kh1=$(2\pi/\lambda)$t1 and a parameter kh2=$(2\pi/\lambda)$t2 are given within a region A-B-C-D-E-F-A in a two-dimensional Cartesian coordinate graph having ordinate axis of the kh1 and abscissa axis of kh2, the outer edge of the region A-B-C-D-E-F-A being given by a closed chain in the Cartesian coordinate, consisting of points A, B, C, D, E, and F, and lines A–B, B–C, C–D, D–E, E–F and F–A, the point A being given by a coordinate point (kh2=0.330, kh1=0.300); the point B being given by a coordinate point (kh2=0.245, kh1=0.250); the point C being given by a coordinate point (kh2=0.250, kh1=0.200); the point D being given by a coordinate point (kh2=0.575, kh1=0.200); the point E being given by a coordinate point (kh2=0.580, kh1=0.214); and the point F being given by a coordinate point (kh2=0.475, kh1=0.300).

The layer structure of this SAW device is schematically illustrated in FIG. 23, and the region AB-C-D-E-F-A indicating the preferable combination of kh1 and kh2 is shown in a two-dimensional Cartesian coordinate graph of FIG. 4.

The second SAW device according to the present invention has the ZnO layer having the thickness of t1, where the parameter kh1=$(2\pi/\lambda)$t1 of not more than 0.3, which is much lower than the value of the same parameter kh1=$(2\pi/\lambda)$t1 of SAW devices disclosed in aforementioned U.S. Pat. No. 5,446,329 to Nakahata et.al. Further, the second SAW device according to the present invention has thinner ZnO layer relative to Al IDT, where thickness ratio of t1 (ZnO layer) to t3 (Al IDT):t1/t3 is 4.8 (=0.300/0.0625) at largest. Therefore, the SAW device is capable of being provided with higher propagation velocity V, lower temperature coefficient for frequency TCF, while achieving lower propagation loss.

The SAW device having above constitution is capable of being provided with propagation velocity V of from 8,000 to 9,200 (m/s) and temperature coefficient for frequency TCF of from −10 to 10 (ppm/°C.). The SAW device is also capable of being provided with propagation loss of 0.03 (dB/λ), which is lower than that of SAW devices (0.051–0.053 (db/λ)) of aforementioned U.S. Pat. No. 5,446,329.

The third SAW device according to the present invention comprises: (i) a diamond layer, (ii) an aluminum (Al) interdigital transducer (IDT) formed on the diamond layer, the Al IDT having a thickness of t3, (iii) a polycrystalline c-axis oriented ZnO layer formed over the Al IDT and on the diamond layer, the ZnO layer having a thickness of t1, and (iv) a $SiO_2$ layer formed over the ZnO layer, the $SiO_2$ layer having a thickness of t2; wherein, for 1st mode surface acoustic wave having a wavelength λ, a parameter kh3=(2π/λA)t3 satisfies: 0.0470≤kh3≤0.0625, and wherein a parameter kh1=(2π/λ)t1 and a parameter kh2=(2π/λ)t2 are given within a region A-B-C-D-E-F-A in a twodimensional Cartesian coordinate graph having ordinate axis of the kh1 and abscissa axis of kh2, the outer edge of the region A-B-C-D-E-F-A being given by a closed chain in the Cartesian coordinate, consisting of points A, B, C, D, E, and F, and lines A–B, B–C, C–D, D–E, E–F and F–A, the point A being given by a coordinate point (kh2=0.650, kh1=0.300); the point B being given by a coordinate point (kh2=0.480, kh1=0.206); the point C being given by a coordinate point (kh2=0.490, kh1=0.200); the point D being given by a coordinate point (kh2=0.850, kh1=0.200); the point E being given by a coordinate point (kh2=0.955, kh1=0.256); and the point F being given by a coordinate point (kh2=0.900, kh1=0.300).

The layer structure of this SAW device is schematically illustrated in FIG. 23, and the region A-B-C-D-E-F-A indicating the preferable combination of kh1 and kh2 is shown in a two-dimensional Cartesian coordinate graph of FIG. 5.

The third SAW device according to the present invention has the ZnO layer having the thickness of t1, where the parameter kh1=(2π/λ)t1 of not more than 0.3, which is much lower than the value of the same parameter kh1=(2π/λ)t1 of SAW devices disclosed in aforementioned U.S. Pat. No. 5,446,329 to Nakahata et.al. Further, the third SAW device according to the present invention has thinner ZnO layer relative to Al IDT, where thickness ratio of t1 (ZnO layer) to t3 (Al IDT):t1/t3 is 6.38 (=0.300/0.0470) at largest. Therefore, the SAW device is capable of being provided with higher propagation velocity V, lower temperature coefficient for frequency TCF, while achieving lower propagation loss.

The SAW device having above constitution is capable of being provided with propagation velocity V of from 9,200 to 12,800 (m/s), the lower and higher limits of which are higher than that of SAW device for 1st mode SAW (V: 8,000 to 10,000) disclosed in aforementioned U.S. Pat. No. 5,446,329, and temperature coefficient for frequency TCF of from −10 to 10 (ppm/°C.). The SAW device is also capable of being provided with propagation loss of 0.05 (dB/λ).

In order to compare the propagation loss of this SAW device for 1st mode SAW with that of SAW devices disclosed in aforementioned U.S. Pat. No. 5,446,329 to Nakahata et.al., measurements of propagation loss of SAW devices according to U.S. Pat. No. 5,446,329 was carried out as another comparative example, details of which will be described later. In the comparative example, propagation loss of the SAW devices for 1st mode SAW, having layer constitution of FIG. 23, and having a constitution satisfying the relationship of kh1 (kh of ZnO) and kh2 (kh of $SiO_2$) surrounded by 4 circles in FIG. 15 of U.S. Pat. No. 5,446,329 (14th column, lines 18 to 19), was obtained, and the obtained propagation loss was 0.079 to 0.083 (dB/λ), which was higher than that of the third SAW device according to the present invention.

The fourth SAW device according to the present invention comprises: (i) a diamond layer, (ii) an aluminum (Al) interdigital transducer (IDT) formed on the diamond layer, the Al IDT having a thickness of t3, (iii) a polycrystalline c-axis oriented ZnO layer formed over the Al IDT and on the diamond layer, the ZnO layer having a thickness of t1, and (iv) a $SiO_2$ layer formed over the ZnO layer, the $SiO_2$ layer having a thickness of t2; wherein, for 1st mode surface acoustic wave having a wavelength λ, a parameter kh3=(2π/λ)t3 satisfies: 0.0625≤kh3≤0.0780, and wherein a parameter kh1=(2π/λ)t1 and a parameter kh2=(2π/λ)t2 are given within a region A-B-C-D-E-A in a twodimensional Cartesian coordinate graph having ordinate axis of the kh1 and abscissa axis of kh2, the outer edge of the region A-B-C-D-E-A being given by a closed chain in the Cartesian coordinate, consisting of points A, B, C, D, and E, and lines A-B, B-C, C-D, D-E, and E-A, the point A being given by a coordinate point (kh2=0.730, kh1=0.300); the point B being given by a coordinate point (kh2=0.530, kh1=0.200); the point C being given by a coordinate point (kh2=0.850, kh1=0.200); the point D being given by a coordinate point (kh2=0.955, kh1=0.256); and the point E being given by a coordinate point (kh2=0.900, kh1=0.300).

The layer structure of this SAW device is schematically illustrated in FIG. 23, and the region A-B-C-D-E-A indicating the preferable combination of kh1 and kh2 is shown in a two-dimensional Cartesian coordinate graph of FIG. 6.

The fourth SAW device according to the present invention has the ZnO layer having the thickness of t1, where the parameter kh1=(2π/λ)t1 of not more than 0.3, which is much lower than the value of the same parameter kh1=(2π/λ)t1 of SAW devices disclosed in aforementioned U.S. Pat. No. 5,446,329 to Nakahata et.al. Further, the fourth SAW device according to the present invention has thinner ZnO layer relative to Al IDT, where thickness ratio of t1 (ZnO layer) to t3 (Al IDT):t1/t3 is 4.8 (=0.300/0.0625) at largest. Therefore, the SAW device is capable of being provided with higher propagation velocity V, lower temperature coefficient for frequency TCF, while achieving lower propagation loss.

The SAW device having above constitution is capable of being provided with propagation velocity V of from 9,200 to 12,800 (m/s), the lower and higher limits of which are higher than that of SAW device for 1st mode SAW (V: 8,000 to 10,000) disclosed in aforementioned U.S. Pat. No. 5,446,329, and temperature coefficient for frequency TCF of from −10 to 10 (ppm/°C.). The SAW device is also capable of being provided with propagation loss of 0.05 (dB/λ), which is lower than that of SAW devices for 1st mode SAW (0.079–0.083 (db/λ)) of aforementioned U.S. Pat. No. 5,446,329.

The fifth SAW device according to the present invention comprises: (i) a diamond layer, (ii) an interdigital transducer (IDT) formed on the diamond layer, the IDT having a thickness of t3, (iii) a polycrystalline c-axis oriented ZnO layer formed over the IDT and on the diamond layer, the ZnO layer having a thickness t1 satisfying t1/t3≥10, and (iv) a $SiO_2$ layer formed over the ZnO layer, the $SiO_2$ layer having a thickness of t2; wherein, for 0th mode surface acoustic wave having a wavelength λ, wherein a parameter kh1 (2π/λ)t1 and a parameter kh2=(2π/λ)t2 are given within a region A-B-C-D-E-F-A in a two-dimensional Cartesian coordinate graph having ordinate axis of the kh1 and abscissa axis of kh2, the outer edge of the region A-B-C-D-E-F-A being given by a closed chain in the Cartesian coordinate, consisting of points A, B, C, D, and E, and lines A–B, B–C, C–D, D–E, E–F, and F–A, the point A being given by a coordinate point (kh2=0.115, kh1=0.300); the point B being given by a coordinate point (kh2=0.090, kh1=0.280); the point C being given by a coordinate point (kh2=0.260, kh1=0.200); the point D being given by a coordinate point (kh2=0.530, kh1=0.200); the point E being given by a coordinate point (kh2=0.540, kh1=0.290); and the point F being given by a coordinate point (kh2=0.520, kh1=0.300).

The layer structure of this SAW device is schematically illustrated in FIG. 23, and the region A-B-C-D-E-F-A indicating the preferable combination of kh1 and kh2 is shown in a two-dimensional Cartesian coordinate graph of FIG. 1.

The fifth SAW device according to the present invention has the ZnO layer having the thickness of t1, where the parameter kh1=$(2\pi/\lambda)$t1 of not more than 0.3, which is much lower than the value of the same parameter kh1=$(2\pi/\lambda)$t1 of SAW devices disclosed in aforementioned U.S. Pat. No. 5,446,329 to Nakahata et.al. Therefore, the SAW device is capable of being provided with higher propagation velocity V, lower temperature coefficient for frequency TCF, while achieving lower propagation loss.

The SAW device having above constitution is capable of being provided with propagation velocity V of from 8,000 to 9,200 (m/s), and temperature coefficient for frequency TCF of from −10 to 10 (ppm/°C.). The SAW device is also capable of being provided with propagation loss of 0.03 (dB/$\lambda$), which is lower than that of SAW devices for 0th mode SAW (0.05–0.053 (db/$\lambda$)) of aforementioned U.S. Pat. No. 5,446,329.

The sixth SAW device according to the present invention comprises: (i) a diamond layer, (ii) an interdigital transducer (IDT) formed on the diamond layer, the IDT having a thickness of t3, (iii) a polycrystalline c-axis oriented ZnO layer formed over the IDT and on the diamond layer, the ZnO layer having a thickness t1 satisfying t1/t3≧10, and (iv) a $SiO_2$ layer formed over the ZnO layer, the $SiO_2$ layer having a thickness of t2; wherein, for 1st mode surface acoustic wave having a wavelength $\lambda$, wherein a parameter kh1=$(2\pi/\lambda)$t1 and a parameter kh2=$(2\pi/\lambda)$t2 are given within a region A-B-C-D-E-A in a two-dimensional Cartesian coordinate graph having ordinate axis of the kh1 and abscissa axis of kh2, the outer edge of the region A-B-C-D-E-A being given by a closed chain in the Cartesian coordinate, consisting of points A, B, C, D, and E, and lines A-B, B-C, C-D, D-E, and E-A, the point A being given by a coordinate point (kh2=0.325, kh1=0.300 ); the point B being given by a coordinate point (kh2=0.255, kh1=0.257); the point C being given by a coordinate point (kh2=0.400, kh1=0.200); the point D being given by a coordinate point (kh2=0.500, kh1=0.200); and the point E being given by a coordinate point (kh2=0.760, kh1=0.300).

The layer structure of this SAW device is schematically illustrated in FIG. 23, and the region A-B-C-D-E-A indicating the preferable combination of kh1 and kh2 is shown in a two-dimensional Cartesian coordinate graph of FIG. 2.

The sixth SAW device according to the present invention has the ZnO layer having the thickness of t1, where the parameter kh1=$(2\pi/\lambda)$t1 of not more than 0.3, which is much lower than the value of the same parameter kh1=$(2\pi/\lambda)$t1 of SAW devices disclosed in aforementioned U.S. Pat. No. 5,446,329 to Nakahata et.al. Therefore, the SAW device is capable of being provided with higher propagation velocity V, lower temperature coefficient for frequency TCF, while achieving lower propagation loss.

The SAW device having above constitution is capable of being provided with propagation velocity V of from 9,000 to 12,800 (m/s), and temperature coefficient for frequency TCF of from −10 to 10 (ppm/°C.). The SAW device is also capable of being provided with propagation loss of 0.05 (dB/$\lambda$), which is lower than that of SAW devices for 1st mode SAW (0.079–0.083 (db/$\lambda$)) of aforementioned U.S. Pat. No. 5,446,329.

Each of these six SAW devices (the first to the sixth SAW devices) according to the present invention has the $SiO_2$ layer of the appropriate thickness, so that the device is provided with higher effective coupling coefficient($K^2$) for effectively converting the electrical energy into mechanical energy on the surface of the device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 23:
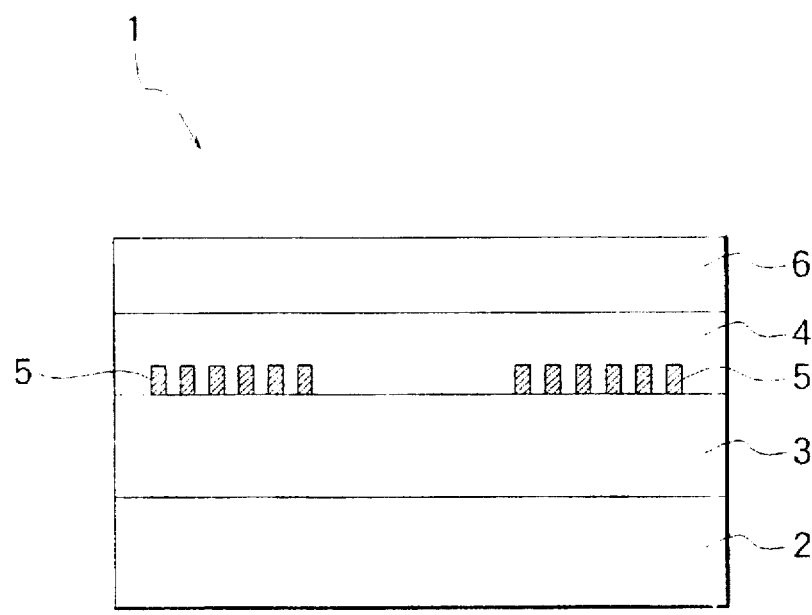
FIGS. 23 is a schematic sectional view illustrating layer structure of the SAW device according to the present invention.

FIG. 23 is a schematic cross-sectional view of the SAW device according to the present invention. As shown in FIG. 23, a SAW device 1 according to the present invention has an aluminum interdigital transducer (Al IDT) 5 formed on a surface of a diamond layer 3 deposited on a Si layer 2. Diamond layer 3 serves as a hard material layer for enhancing propagation velocity of surface acoustic device (SAW). IDTs 5 are formed at the input and the output sides, respectively. ZnO layer 4, the piezoelectric material layer, is formed so as to cover IDTs 5, and an amorphous $SiO_2$ layer 6 is formed so that ZnO layer 4 and IDTs 5 are protected by the passivating amorphous silicon layer 6. Since ZnO piezoelectric layer 4 and IDTs 5 are sandwitched between diamond hard material layer 3 and $SiO_2$ passivating layer 6, the main portion of the SAW device consisting of the piezoelectric layer and the electrodes are effectively protected, and higher electromechanical coupling is achieved.

The present invention will be described in detail as following, focusing on materials employed in the present invention.

(Diamond)

The diamond material preferable for the use in the present invention may be either natural diamond or synthetic diamond. The diamond may be single crystalline diamond or polycrystalline diamond. The diamond plate/substrate itself can be used for fabricating SAW devices according to the present invention. Diamond layer/film formed on the other base material can also be employed.

The base material used for forming diamond film is not particularly limited, but may appropriately be selected depending on the usage of the SAW device. For example, the base material to be available in the present invention may comprise semiconductor materials such as crystalline silicon, amorphus silicon, metals, glass and ceramics. The process may appropriately be selected from known synthesis processes such as CVD(Chemical Vapor Deposition) including microwave plasma CVD, plasma enhanced CVD, PVD (Physical Vapor Deposition), sputtering, ion plating, plasma jet method, flame method and hot filament method.

In the case where the diamond film formed on the base material is employed for fabrication of SAW device according to the present invention, a parameter khd, which is defined as $khd = 2\pi td/\lambda$, where td is a thickness of the diamond film/layer and $\lambda$ is a wavelength of SAW, is preferably 4 or higher, and more preferably khd is 8 or higher, because such thicker diamond film can provides less fluctuation in operating performances of the SAW device.

The plane orientation of the diamond may be any of (111), (100) and (110), etc., or may be any combination of these plane orientations. (ZnO layer)

ZnO layer, that is disposed on the diamond and functions as piezoelectric layer of the SAW device according to the present invention, is preferably polycrystalline, and c-axis oriented, in view of piezoelectric property. By "c-axis oriented", it is meant that ZnO layer have a (001) plane that is parallel to a base layer, such as diamond layer, on which the ZnO layer is disposed.

When one attempts to form the thicker ZnO piezoelectric layer, it may be more likely to occur the decrease of structural homogeneity and crystallinity of ZnO. On the contrary, when thinner ZnO layer is formed, the decrease of structural homogeneity and crystallinity of ZnO is less likely to occur during the growth of ZnO. Thus, in general, surfaces of thinner ZnO layer is more planar than surfaces of thicker ZnO layer. Consequently, scattering of SAW through the piezoelectric ZnO layer can be reduced by forming thinner ZnO layer, while the propagation loss is also reduced by reducing the thickness of ZnO layer. (SiO$_2$ layer)

SiO$_2$ layer, that is formed on the ZnO layer and functions as protecting or passivating material for the ZnO layer and IDT according to the present invention, is preferably an amorphous SiO$_2$ layer, in view of electric and mechanical properties of the formed SAW device and formability and processibility.

When device temperature increases, the SAW propagation velocity through SiO$_2$ layer increases while the SAW propagation velocities through diamond and ZnO layer decrease. Thus, SiO$_2$ layer can compensate the variation of the SAW propagation velocity through diamond and ZnO layers to provide the operation stability for temperature variation.

(Interdigital transducer: IDT)

The planar or projected shape of the IDT for the SAW device of the present invention is not limited. Electrode called "single-type" electrode 8 as shown in the schematic plan view of FIG. 24A or electrode called "double-type" electrode 9 as shown in the schematic plan view of FIG. 24B may typically be used for the present invention.

In the present invention, a pair of IDTs are disposed at input side and output side. Any of electric conductive materials can be used for interdigital transducer for the SAW device of the present invention. In view of processibility, Al (aluminum) may preferably be used as the material for the IDT.

The thickness of the IDT is not limited, as long as it functions as an IDT of a SAW device. In general, the thickness of the IDT may typically be in the range of about 100 to about 5,000 Å (more preferably, about 100 to 500 Å). When the thickness of the IDT is less than 100 Å, the electrode resistivity is increased, causing considerable energy loss. On the other hand, when the thickness of the IDT exceeds 5,000 Å, considerable mass addition effect cause reflection of SAW, and desired SAW characteristic of the SAW device may suffer.

In the first, the second, the third and the fourth SAW devices according to the present invention, the preferable ratio of ZnO piezoelectric layer thickness to Al IDT thickness: (t1/t3) may be 1.5 to 8.0, more preferably 2.0 to 7.0, most preferably 2.54 to 6.37, in view of properties such as durability and operating characteristics of the resulting SAW devices. In the fifth and the sixth SAW devices according to the present invention, the preferable range of the ratio of ZnO piezoelectric layer thickness to Al IDT thickness: (t1/t3) may be at least 10, in view of avoiding the effect of Al IDT to characteristics of SAW device.

EXAMPLES

In the preferable examples of the present invention, SAW devices, having a layer constitution illustrated in FIG. 23, and also having different thicknesses of Al IDT 5, ZnO layer, and SiO$_2$ layer 6, were prepared, and the obtained SAW devices were evaluated on the propagation velocity V and the temperature coefficient for frequency TCF. Also, the SAW devices having different spacing between an input and an output IDTs were prepared so as to evaluate the relationship of the propagating length of SAW and the device insertion loss to give the propagation loss of the SAW device.

As shown FIG. 23, SAW device 1 according to the present invention is provided with IDT 5 formed on the surface of diamond layer 3 overlying an Si layer 2, and ZnO layer 4 is formed to cover IDT 5. SiO$_2$ layer 6 is formed on ZnO layer 4 to cover ZnO layer 4 and IDT 5 to form SAW device 1. IDTs 5 are made of aluminum (Al), and two pairs of IDT as the input and the output IDTs are formed.

In these examples, in order to optimize V, TCF and the propagation loss, the SAW devices having different thicknesses of Al IDT 5, ZnO layer, and SiO$_2$ layer 6, were prepared, and V, TCF and the propagation loss of each of the SAW devices were evaluated.

For the purpose of expressing the thicknesses t1 of ZnO layer and t2 of SiO$_2$, with reference to the wavelength $\lambda$ of the applied surface acoustic wave, the following two parameters kh1 and kh2 are employed in the present invention, as used in U.S. Pat. No. 5,446,329:

kh1=$(2\pi/\lambda)$t1, and kh2=$(2\pi/\lambda)$t2. In addition, for the purpose of expressing the thickness t3 of IDT 5 with reference to the wavelength $\lambda$, the parameter kh3=$(2\pi/\lambda)$t2 is also used.

Figure 15:
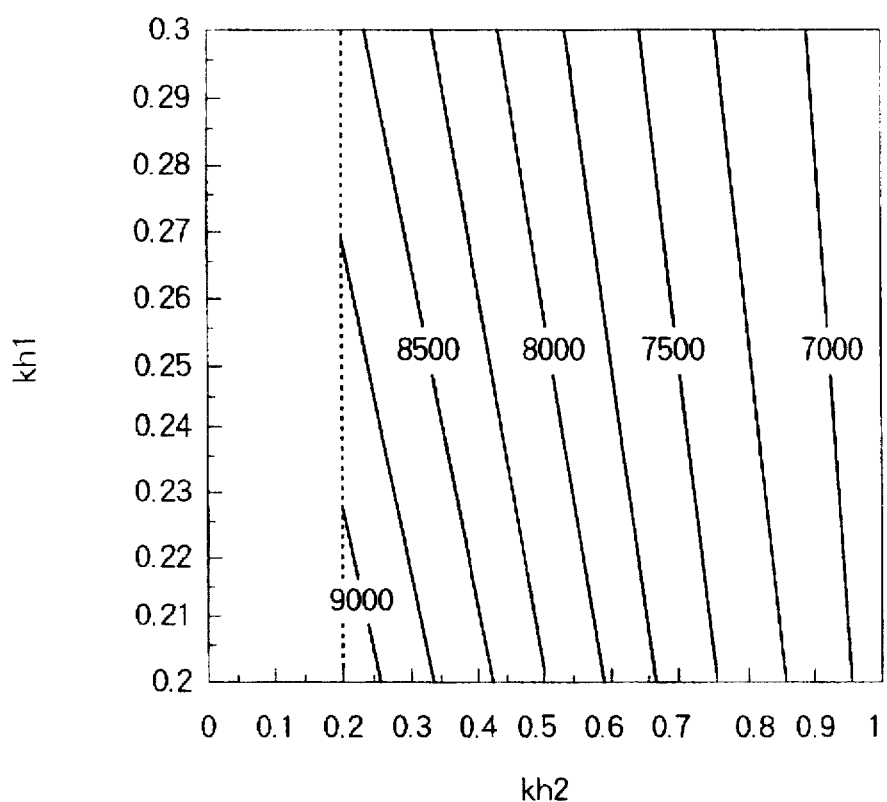
FIG. 15 is a graph showing relationship of parameters kh1 and kh2 of the SAW devices for 0th mode SAW of "the second experimental group" (kh3=0.0780), indicating the variation of the propagation velocity V.

More specifically, each of the SAW devices of two experimental groups (the first experimental group and the second experimental group), detailed of which will be described later, has the same layer constitution as shown in FIG. 23 but different thickness of layers 4,6 and IDT 5, according to the present invention. Further, as a comparative example to carry out comparison of the SAW device of the present invention with the SAW device of aforementioned U.S. Pat. No. 5,446,329 to Nakahata et.al., the third experimental group of the SAW devices for the comparison, which have the layer constitution shown in FIG. 23 but satisfying relationship of kh1 (kh of ZnO) and kh2 (kh of SiO$_2$) surrounded by 4 circles in FIG. 15 of U.S. Pat. No. 5,446,329, as described in "EMBODIMENT 6" (13th column, line 56 to 14th column, line 126) were also prepared.

Figure 24A:
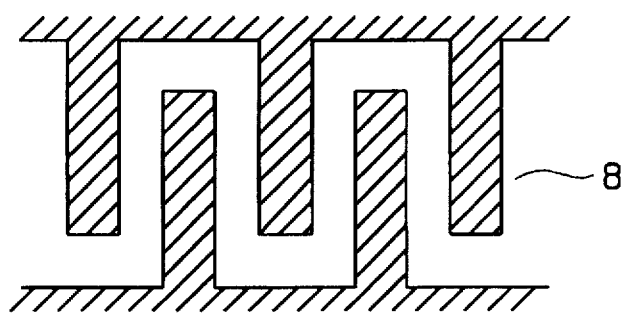
FIG. 24A schematically illustrates a planar shape of an IDT (single-type electrode)
Figure 24B:
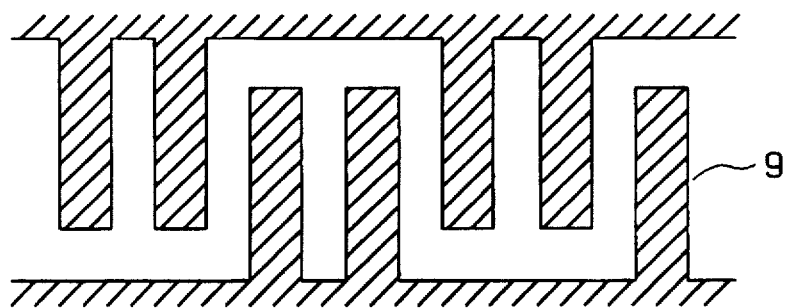
FIG. 24B schematically illustrates a planar shape of an IDT (double-type electrode)
Figure 25:
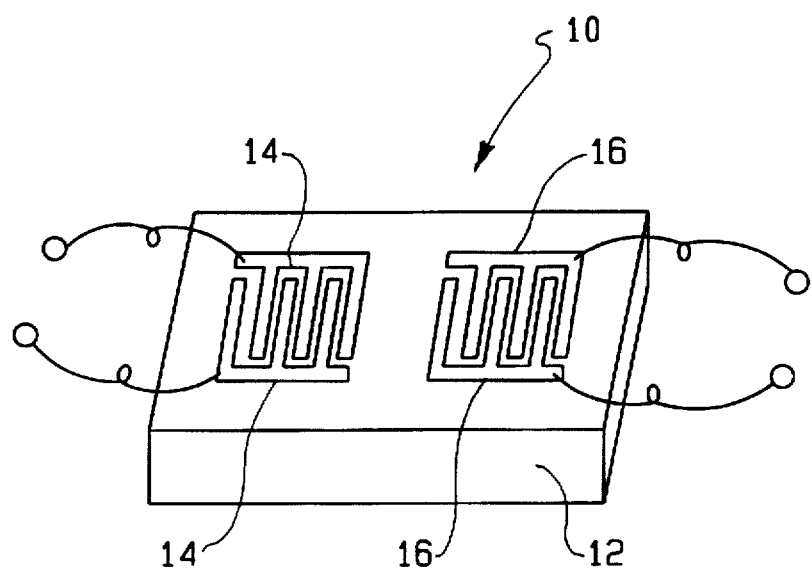
FIG. 25 a schematically illustrates a typical SAW device.

The detailed constitutions of respective experimental groups will be described below. A series of SAW devices of the first experimental group are provided with: Al IDTs of double electrodes (as shown in FIG. 24B) having thickness of 300 angstroms and line width of 1.5 μm ($\lambda_0$ of SAW=12 μm) and tolerance width of 400 μm; diamond layer 3 having the thickness of 20 μm; ZnO layer 4, each of devices having a different thickness of ZnO layer 4 in 10 thickness ranging from 0.382 to 0.573 μm; and SiO$_2$ layer 6, each of devices having a different thickness of SiO$_2$ layer 6 in 10 thickness ranging from 0.1 to 1.9 μm.

A series of SAW devices of the second experimental group are provided with: Al IDTs of single electrodes (as shown in FIG. 24A) having the line width of 1.0 μm ($\lambda_0$ of SAW=4 μm) and tolerance width of 400 μm; diamond layer 3 having the thickness of 20 μm; ZnO layer 4, each of devices having a different thickness of ZnO layer 4 in 10 thickness ranging from 0.127 to 0.191 μm; and SiO$_2$ layer 6, each of devices having a different thickness of SiO$_2$ layer 6 in 10 thickness ranging from 0.1 to 0.63 μm. The thickness of Al IDT 5 of each devices in the series of SAW devices of the second experimental group also has a different thickness in 10 thickness ranging from 300 to 500 angstroms.

A series of SAW devices of the third experimental group (comparative example) are provided with: Al IDTs of double electrodes (as shown in FIG. 24B) having thickness of 300 angstroms, the line width of 1.0 μm ($\lambda_0$ of SAW=4 μm) and tolerance width of 400 μm; diamond layer 3 having the thickness of 20 μm; ZnO layer 4, each of devices having a different thickness of ZnO layer 4 in 10 thickness ranging from 0.57 to 1.15 μm; and SiO$_2$ layer 6, each of devices having a different thickness of SiO$_2$ layer 6 in 10 thickness ranging from 0.76 to 1.53 μm.

In the example of the present invention, SAW devices of the experimental groups 1, 2 and 3 were manufactured as follows.

A polycrystalline diamond film was formed on a (100) plane of monocrystalline silicon having dimension of 10×10×1 (mm) was placed within a vacuum CVD chamber of a microwave plasma CVD apparatus, and the CVD chamber was evacuated. Then a reactant gases mixture which contains $CH_4$ and $H_2(CH_4:H_2=2:100)$ was introduced. Diamond thin film having thickness of 35 μm was then deposited in the plasma created under the condition of:microwave power of 150 W, pressure of about 40 mTorr and temperature of 800° C. The deposited diamond layer was allowed to stand for 10 minutes in the air of 450° C., to enhance the resistance of diamond layer.

After the deposited diamond surface was polished/removed to a thickness of 20 μm, the Si substrate 2 having diamond layer 3 thereon was obtained.

Next, Al layer was deposited on diamond layer 3 via DC sputtering as follows. Substrate 2 was transferred to interior of a DC sputtering chamber, and Ar gas of sputtering gas was introduced into the chamber. DC power of 2.5 kW was applied under the ambient temperature, while the chamber pressure was maintained to be 10 mTorr, to deposit Al layer having the thickness of Al IDT on diamond layer 3 at a deposition rate of 50 (angstrom/sec.). Then, the deposited Al layer was patterned via conventional photolithography and etching to obtain IDT 5 having the predetermined IDT pattern and dimensions. In this process, IDT was formed to have pad electrode portion.

Then, the substrate was transferred to a vacuum chamber of a magnetron sputtering apparatus to deposit ZnO layer. A polycrystalline ZnO target was included within the chamber. The ZnO target was sputtered with flowing a sputtering gas containing Ar and $O_2$ ($Ar:O_2=1:1$) through the chamber, under the sputtering condition of: sputtering power of 150 W, chamber pressure of 50 mTorr and substrate temperature of 300° C., to deposit ZnO layer 4 having predetermined thickness over IDT 5 onto diamond layer 3.

Then, after ZnO target was substituted by $SiO_2$ target, an amorphous $SiO_2$ layer 6 having predetermined thickness was formed via RF sputtering process under the condition of: pressure of 50 mTorr, substrate temperature of 200° C. and $Ar:O_2=1:1$, RF power of 500 W.

Portion of ZnO layer 4 and $SiO_2$ layer 6 overlying the pad electrode portion of IDT 5 was removed by conventional photolithography to expose Al of the pad portion. Thus, the manufacturing of the SAW device was completed.

With respect to each of the SAW devices illustrated in FIG. 23, having different thickness of $SiO_2$ layer 6 and ZnO layer 4, radio frequency (RF) power was applied to the input IDT to generate SAW of 0th and 1st modes. The propagation velocities V (m/s) of the generated SAW were determined depending on a relationship of $V=f_0 \times \lambda_0$ ($f_0$:center frequency, $\lambda_0$: wavelength of SAW).

TCF measurement was carried out by the following manner: SAW device was heated by an external heater from room temperature to 70° C. The central frequency $F_0$ was measured at every 10° C. from the room temperature to 70° C. Proportional relationship between the central frequency and the device temperature. TCF was given by the slope of the relationship.

Further, propagation loss was evaluated by the following manner: SAW devices having same layer/electrode constitution but different spacing between input IDT and output IDT (e.g., 50 wavelength, 100 wavelength and 150 wave length) were fabricated. A relationship of insertion loss with the spacing was evaluated and found that the insertion loss was proportional to the spacing. Then the propagation loss could be obtained by the slope of the relationship. These measurements were conducted by using a network analyzer ("Network Analyzer 8719A", commercially available from Yokogawa Hewlett Packard (YHP), Japan).

The thickness t1 (μm) of the ZnO layers of each SAW devices, and the thickness t2 (μm) of the $SiO_2$ layers of each SAW device were measured by cutting off the device after the measurement of device performances as described above, and observing the resultant section of the device with a scanning electron microscope (SEM). Thus, the values of the parameters (dimensionless thickness) of $kh1=(2\pi/\lambda)t1$ and $kh2=(2\pi/\lambda)t2$ were determined for each of the SAW devices.

Example 1-1

:The first experimental group of SAW devices—(1): optimization of thickness relationship of SAW devices for 0th mode, the fifth SAW device according to the present invention.

In the first experimental group of the SAW devices, the thickness ratio of ZnO piezoelectric layer 4 (t1) to Al IDT 5 (t3) is: $12.7 \leq (t1/t3)$. Variation of the propagation velocity V and the temperature coefficient for frequency TCF, respectively, with the dimensionless thickness of ZnO layer and $SiO_2$ layer are illustrated in FIGS. 7 and 8, respectively.

Figure 7:
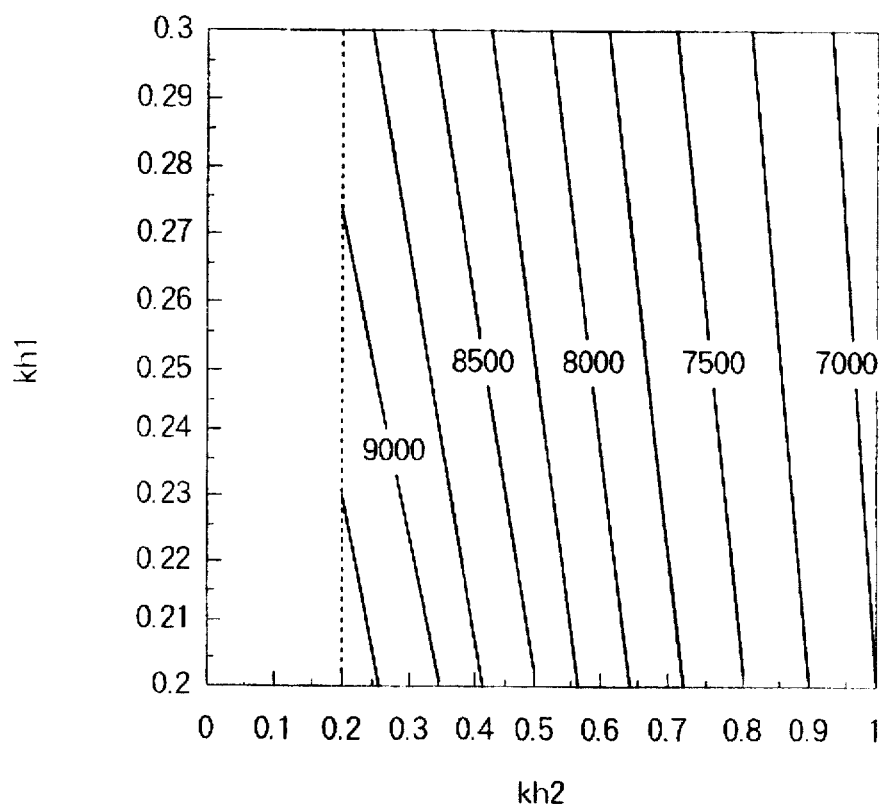
FIG. 7 is a graph showing relationship of parameters kh1 and kh2 of the SAW devices for 0th mode SAW of "the first experimental group", indicating the variation of the propagation velocity V.
Figure 8:
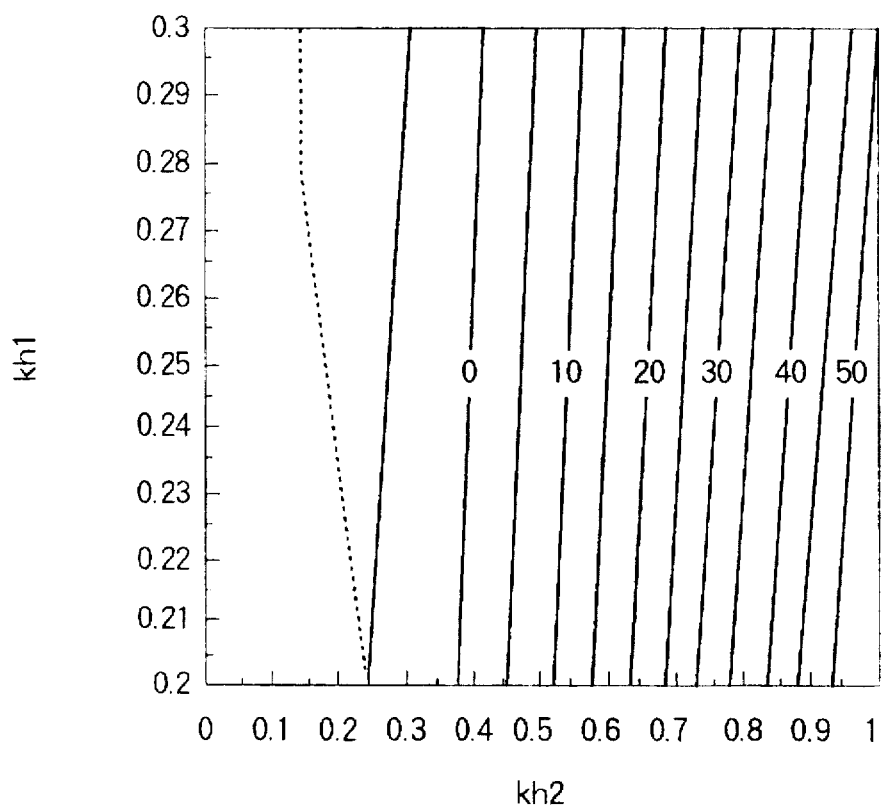
FIG. 8 is a graph showing relationship of parameters kh1 and kh2 of the SAW devices for 0th mode SAW of "the first experimental group", indicating the variation of the temperature coefficient for frequency TCF.

FIG. 7 is a graph showing the variations of V when dimensionless thickness kh1 of ZnO layer and kh2 of SiO2 layer vary. FIG. 8 is a graph showing the variations of TCF when dimensionless thickness kh1 of ZnO layer and kh2 of $SiO_2$ layer vary. In both FIGS. 7 and 8, dotted lines appearing the left most of the graph indicate the boundaries that the devices would not be form-able as a SAW device when the dimensionless thickness kh2 of $SiO_2$ layer decreases to a dimensionless thickness less than the boundaries.

As mentioned before, it is an object of the present invention to provide SAW devices for 0th mode surface acoustic wave, having V of 8,000 to 9,200 (m/s), TCF of −10 to 10 (ppm/°C.), and lower propagation loss than that of SAW devices of aforementioned U.S. Pat. No. 5,446,329 to Nakahata et.al. Therefore, the optimal kh1 and kh2 satisfying the object were evaluated by using the results shown in FIGS. 7 and 8. Consequently, it is found that the optimal kh1 and kh2 for providing the preferable V and TCF should be included in a region A-B-C-D-E-F-A shown in FIG. 1, to obtain the fifth SAW device of the present invention. The propagation loss of the fifth SAW devices was measured and the results were 0.028 to 0.031 (dB/λ), as shown in TABLE −1.

Figure 1:
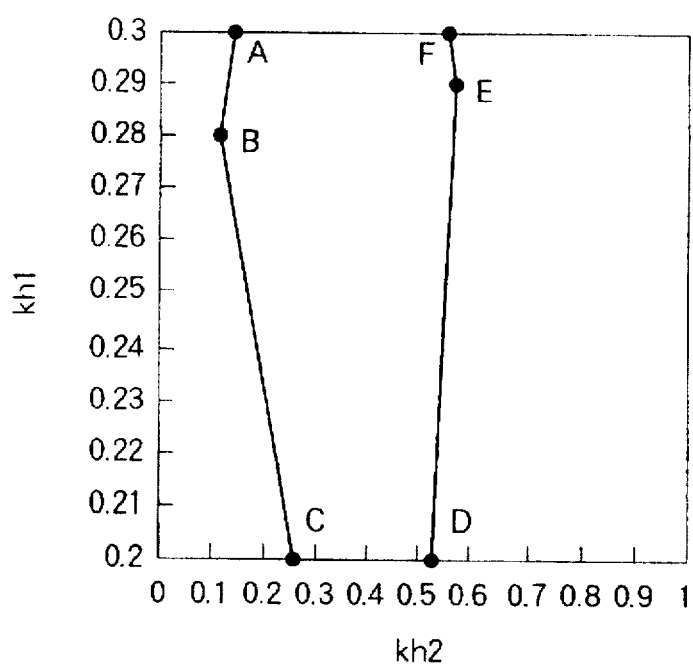
FIG. 1 is a graph in the two-dimensional Cartesian coordinate having abscissa axis of kh1 and ordinate axis of kh2, illustrating the region A-B-C-D-E-F-A providing preferable range of kh1 and kh2 for the fifth SAW device according to the present invention.

Although the Example 1-1 have been described for the SAW devices having the thickness ratio $(t1/t3) \geq 12.7$, it is thought that the preferable range of kh1 and kh2 included in the region A-B-C-D-E-F-A shown in FIG. 1 is also applicable to the SAW devices having the thickness ratio $(t1/t3) \geq 10$, because the Al IDT of such devices having the thickness ratio $(t1/t3) \geq 10$ will not affect the characteristics of SAW devices.

TABLE 1

The fifth SAW device of the present invention: The SAW devices having dimensionless thickness kh1 and kh2 included in the region A-B-C-D-E-F-A shown in Fig. 1.

| kh1 | kh2 | mode of SAW | propagation loss |
|---|---|---|---|
| 0.23 | 0.30 | 0th | 0.028 (dB/λ) |
| 0.25 | 0.40 | 0th | 0.031 |
| 0.25 | 0.50 | 0th | 0.029 |
| 0.28 | 0.40 | 0th | 0.030 |

Example 1-2

The first experimental group of SAW devices—(2): optimization of thickness relationship of SAW devices for 1st mode, the sixth SAW device according to the present invention.

As in the previous Example 1-1 for 0th mode SAW, the thickness ratio of ZnO piezoelectric layer 4 (t1) to Al IDT 5 (t3) of the SAW devices of Example 1-2 (the first experimental group for 1st mode of SAW) is: $12.7 \leq (t1/t3)$. Variation of the propagation velocity V and the temperature coefficient for frequency TCF, respectively, with the dimensionless thickness of ZnO layer and $SiO_2$ layer are illustrated in FIGS. 9 and 10, respectively.

Figure 9:
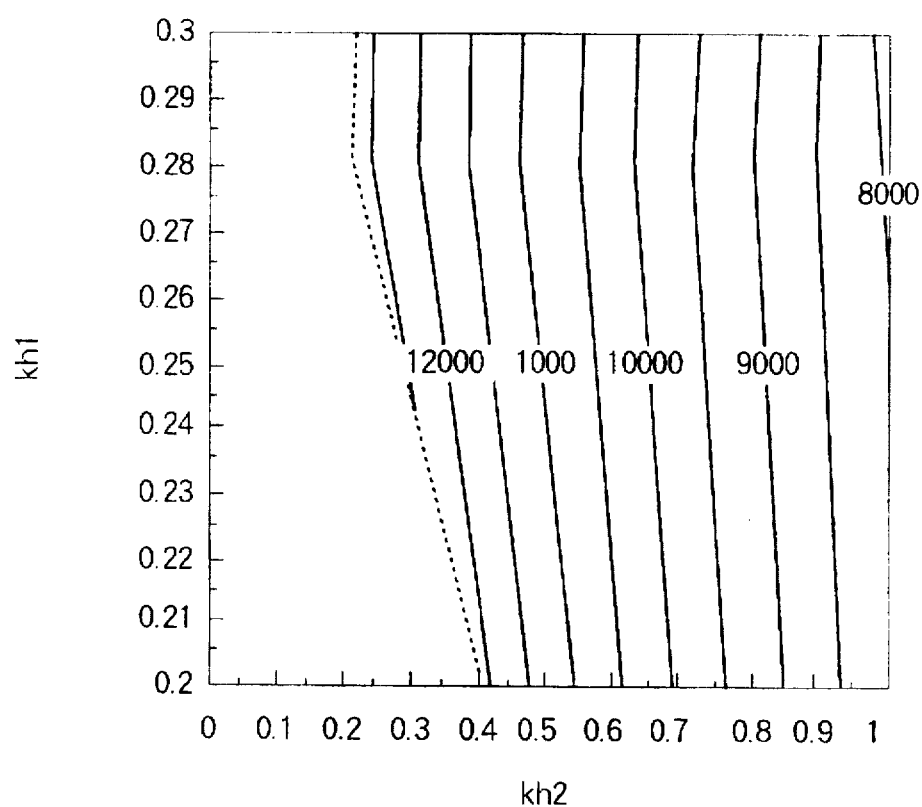
FIG. 9 is a graph showing relationship of parameters kh1 and kh2 of the SAW devices for 1st mode SAW of "the first experimental group", indicating the variation of the propagation velocity V.
Figure 10:
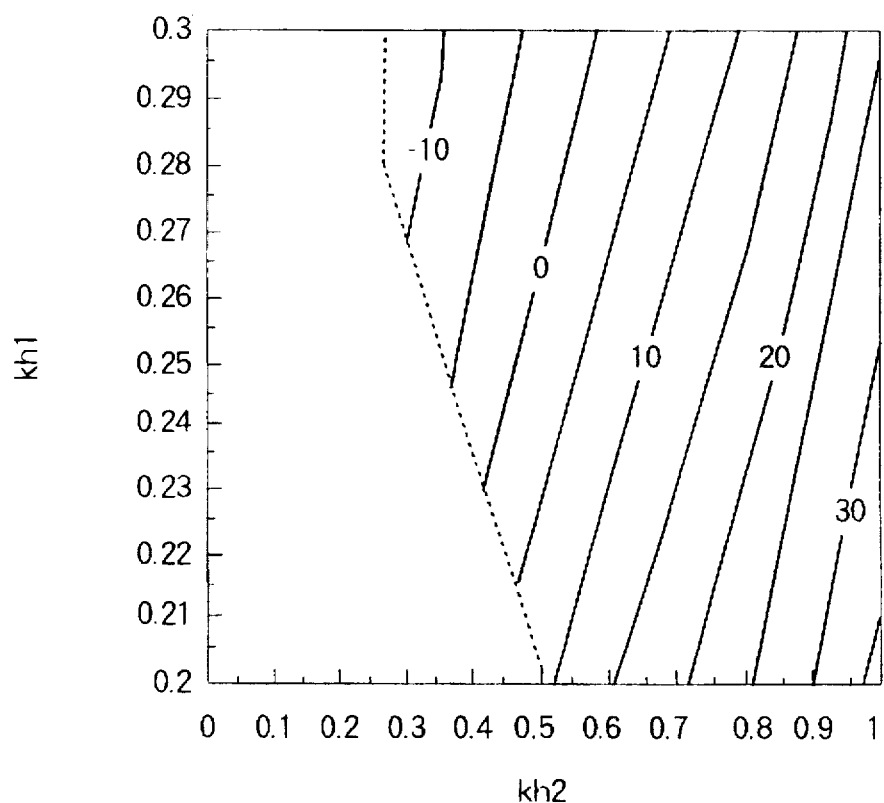
FIG. 10 is a graph showing relationship of parameters kh1 and kh2 of the SAW devices for 1st mode SAW of "the first experimental group", indicating the variation of the temperature coefficient for frequency TCF.

FIG. 9 is a graph showing the variations of V when dimensionless thickness kh1 of ZnO layer and kh2 of $SiO_2$ layer vary. FIG. 10 is a graph showing the variations of TCF when dimensionless thickness kh1 of ZnO layer and kh2 of $SiO_2$ layer vary. In both FIGS. 9 and 10, dotted lines appearing the left most of the graph indicate the boundaries that the devices would not be form-able as a SAW device when the dimensionless thickness kh2 of $SiO_2$ layer decreases to a dimensionless thickness less than the boundaries.

As mentioned before, it is an object of the present invention to provide SAW devices for 1st mode surface acoustic wave, having V of 9,000 to 12,800 (m/s), TCF of −10 to 10 (ppm/°C.), and lower propagation loss than that of SAW devices of aforementioned U.S. Pat. No. 5,446,329 to Nakahata et.al. Therefore, the optimal kh1 and kh2 satisfying the object were evaluated by using the results shown in FIGS. 9 and 10. Consequently, it is found that the optimal kh1 and kh2 for providing the preferable V and TCF should be included in a region A-B-C-D-E-A shown in FIG. 2, to obtain the sixth SAW device of the present invention. The propagation loss of the sixth SAW devices was measured and the results were 0.028 to 0.031 (dB/λ), as shown in TABLE -2.

Figure 2:
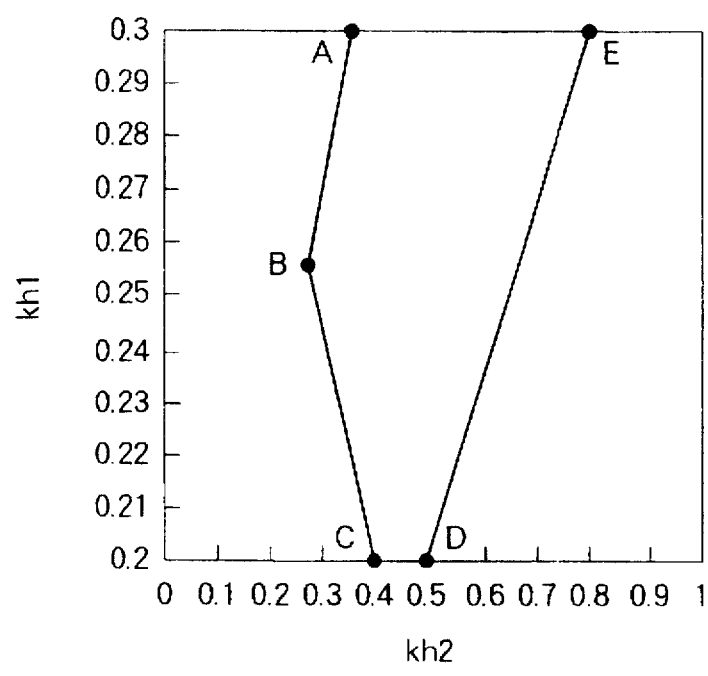
FIG. 2 is a graph in the two-dimensional Cartesian coordinate having abscissa axis of kh1 and ordinate axis of kh2, illustrating the region A-B-C-D-E-A providing preferable range of kh1 and kh2 for the sixth SAW device according to the present invention.

Although the Example 1-2 have been described for the SAW devices having the thickness ratio $(t1/t3) \geq 12.7$, it is thought that the preferable range of kh1 and kh2 included in the region A-B-C-D-E-A shown in FIG. 2 is also applicable to the SAW devices having the thickness ratio $(t1/t3) \geq 10$, because the Al IDT of such devices having the thickness ratio $(t1/t3) \geq 10$ will not affect the characteristics of SAW devices.

TABLE 2

The sixth SAW device of the present invention:
The SAW devices having dimensionless thickness kh1 and kh2 included in the region A-B-C-D-E-A shown in Fig. 2.

| kh1 | kh2 | mode of SAW | propagation loss |
|------|------|------|------|
| 0.23 | 0.40 | 1st | 0.053 (dB/λ) |
| 0.25 | 0.50 | 1st | 0.051 |
| 0.25 | 0.55 | 1st | 0.047 |
| 0.28 | 0.50 | 1st | 0.047 |

Example 2-1

The second experimental group of SAW devices—(1): optimization of thickness relationship of SAW devices for 0th mode, the first and the second SAW devices according to the present invention.

In the second experimental group of the SAW devices, the thickness ratio of ZnO piezoelectric layer 4 (t1) to Al IDT 5 (t3) is: $2.54 \leq (t1/t3) \leq 6.37$. It has been found that, in the devices having such thickness ratio (t1/t3), the thickness of the Al IDT is so large with reference to the thickness of ZnO layer that the characteristics such as V, TCF and the propagation loss of the SAW devices are affected by the thickness of the IDT. In the second experimental group of SAW devices, the SAW devices having different thickness of Al IDT 5, as well as different thickness of ZnO and $SiO_2$ layers, were fabricated to determine optimal dimensionless thickness kh3 of Al IDT 5, as well as the dimensionless thickness kh1 and kh2. As described below, optimal ranges of kh1 and kh2 in the case of SAW devices having kh3 of from 0.047 to 0.0780 were determined, for the second experimental group of SAW devices. As described below, it was also found that all the preferable range of kh1 and kh2 corresponding to entire range of kh3 (0.047 to 0.0780) could be covered by obtained three sets of preferable ranges of kh1 and kh2 at kh3=0.047, 0.0625 and 0.0780.

Figure 11:
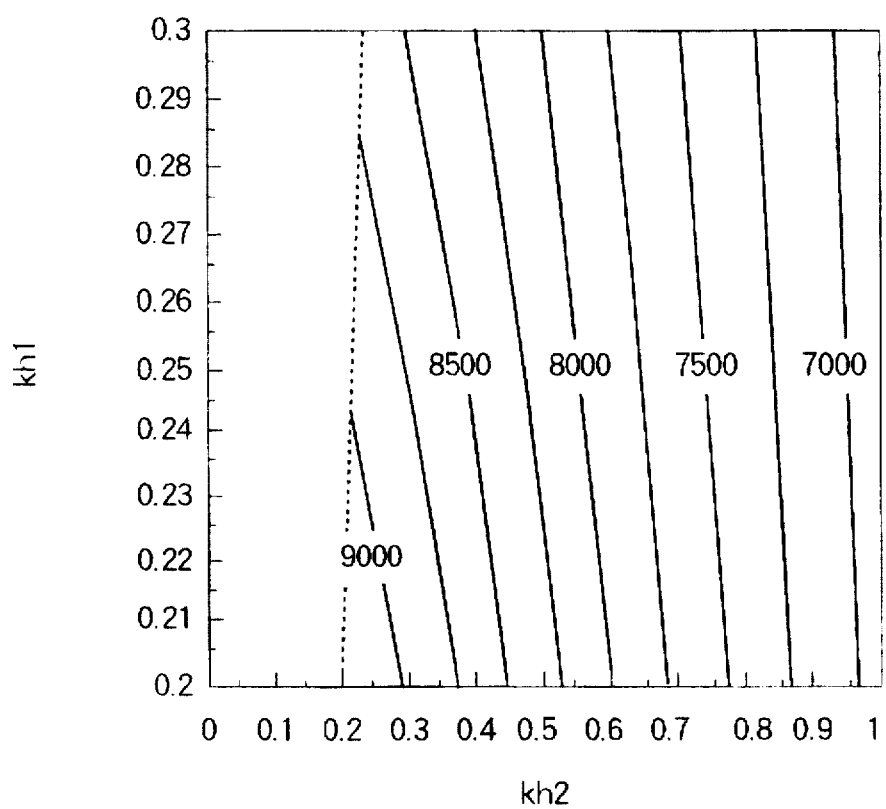
FIG. 11 is a graph showing relationship of parameters kh1 and kh2 of the SAW devices for 0th mode SAW of "the second experimental group" (kh3=0.0470), indicating the variation of the propagation velocity V.
Figure 12:
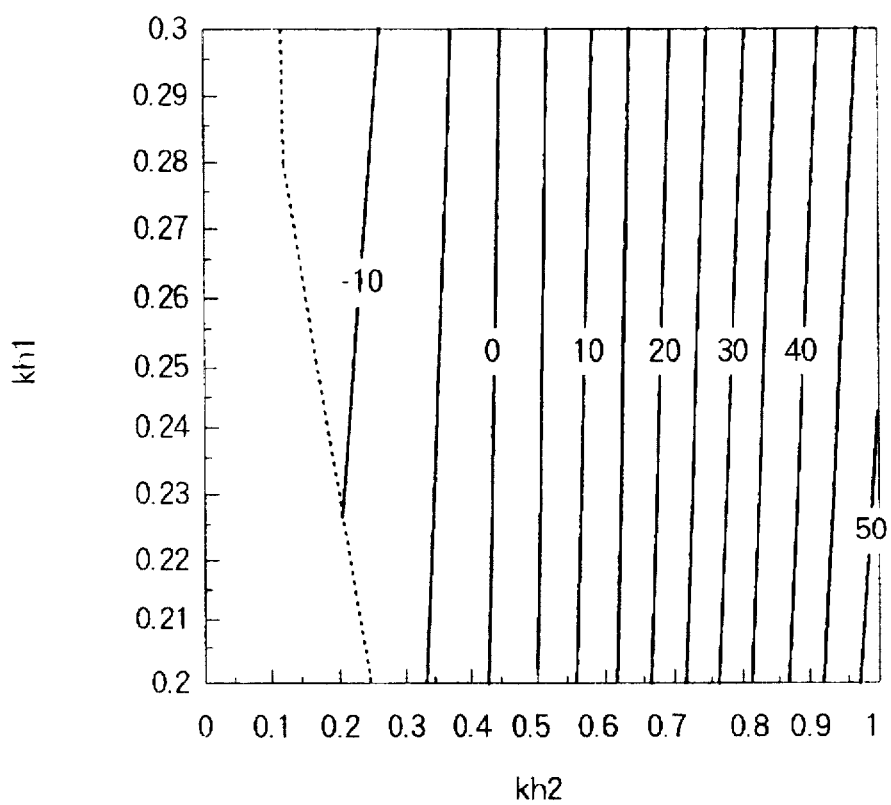
FIG. 12 is a graph showing relationship of parameters kh1 and kh2 of the SAW devices for 0th mode SAW of "the second experimental group" (kh3=0.0470), indicating the variation of the temperature coefficient for frequency TCF.

Variation of the propagation velocity V with the dimensionless thickness of ZnO layer and $SiO_2$ layer are illustrated in FIGS. 11(kh3=0.047), 13(kh3=0.0625) and 15(kh3=0.0780). Variation of the temperature coefficient for frequency TCF with the dimensionless thickness of ZnO layer and $SiO_2$ layer are illustrated in FIGS. 12(kh3=0.047), 14(kh3=0.0625) and 16(kh3=0.078)

Figure 13:
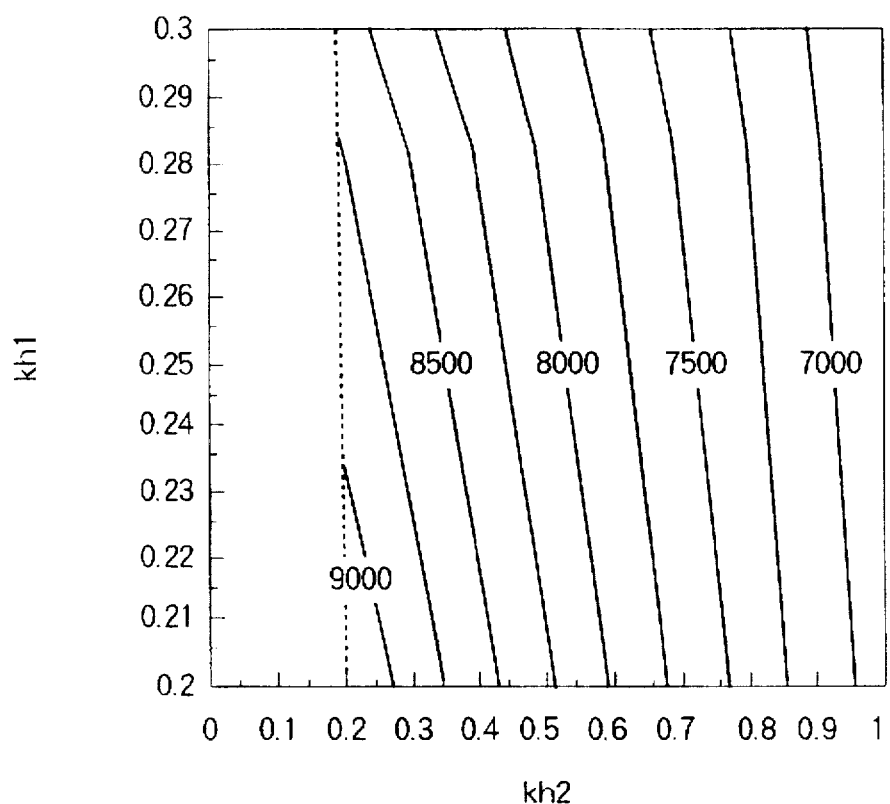
FIG. 13 is a graph showing relationship of parameters kh1 and kh2 of the SAW devices for 0th mode SAW of "the second experimental group" (kh3=0.0625), indicating the variation of the propagation velocity V.
Figure 14:
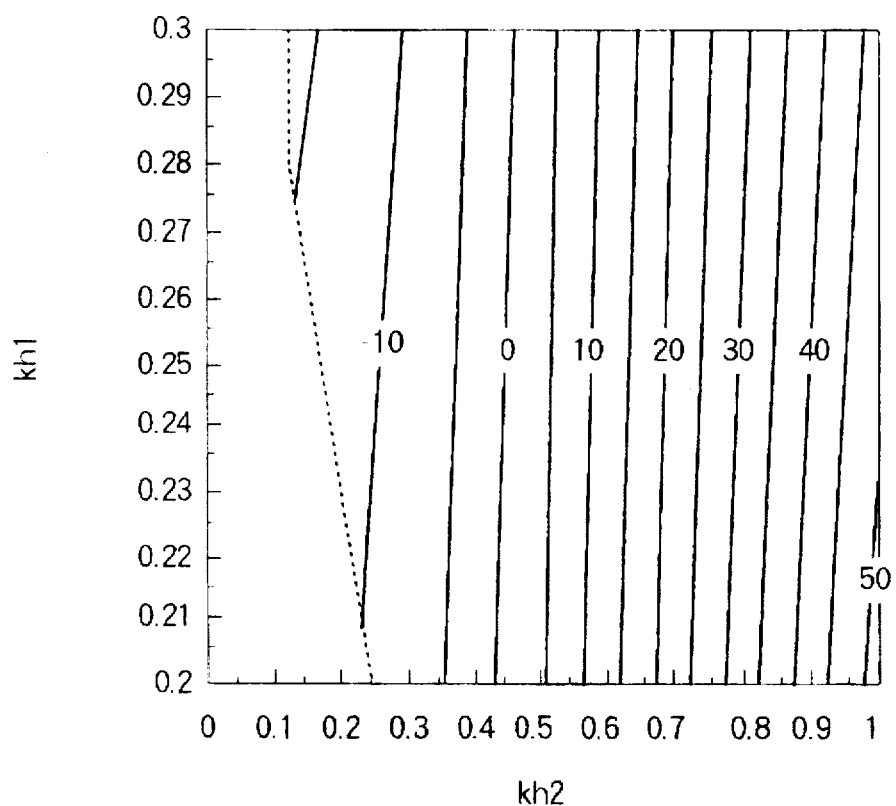
FIG. 14 is a graph showing relationship of parameters kh1 and kh2 of the SAW devices for 0th mode SAW of "the second experimental group" (kh3=0.0625), indicating the variation of the temperature coefficient for frequency TCF.
Figure 16:
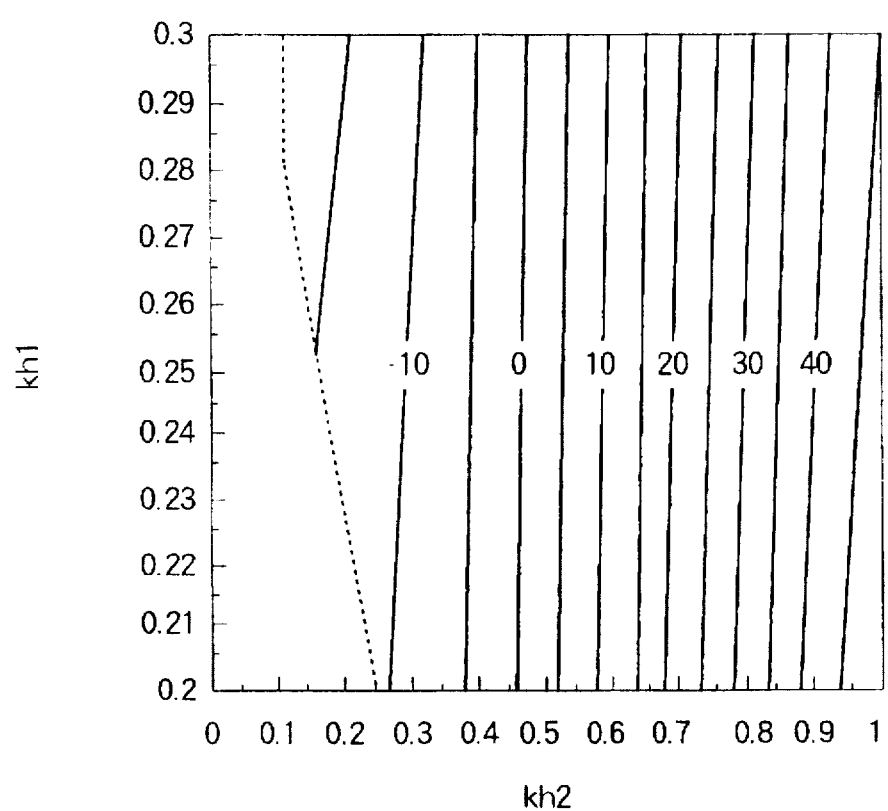
FIG. 16 is a graph showing relationship of parameters kh1 and kh2 of the SAW devices for 0th mode SAW of "the second experimental group" (kh3=0.0780), indicating the variation of the temperature coefficient for frequency TCF.

FIG. 11 is a graph showing the variations of V when dimensionless thickness kh1 of ZnO layer and kh2 of $SiO_2$ layer vary at kh3=0.0470. FIG. 13 is a graph showing the variations of V at kh3=0.0625. In the series of evaluation of this Example, it was found that, when kh3 changes , for example from 0.047 to 0.0625, the V-contours in the graph of FIG. 11 monotonically and continuously move to the corresponding V-contour in the graph of FIG. 13. More specifically, the contour indicating V=8,000 (m/sec.) in FIG. 11 (kh3=0.047) is gradually shifted as kh3 increases, toward the contour of V=8,000 (m/sec.) in FIG. 13, and is eventually identical to the contour of V=8,000 (m/sec.) in FIG. 13 when kh3 reaches 0.0625. Therefore, all the preferable range of kh1 and kh2 corresponding to range of kh3 (0.047 to 0.0625) could be covered by using each of the obtained two sets of preferable ranges of kh1 and kh2, at kh3=0.047 and 0.0625, respectively. Similarly, all the preferable range of kh1 and kh2 for kh3=0.0625 to 0.0780 can also be covered by using each of the obtained two sets of preferable ranges of kh1 and kh2, at kh3=0.0625 and 0.0780, respectively. Further, this phenomenon can be applied to the shifting of the TCF-contours with the change of kh3, in which TCF-contours in FIG. 12 are monotonically and continuously shifted through corresponding one in FIG. 14 to corresponding one in FIG. 16, with the change of kh3 from 0.047 through 0.0625 to 0.0780. Further, this phenomenon can also be applied in the cases of SAW devices for 1st mode SAW.

In these FIGS. 11, 12, 13, 14, 15 and 16, dotted lines appearing the left most of the graph indicate the boundaries of the kh2 that the devices would not be form-able as a SAW device when the dimensionless thickness kh2 of $SiO_2$ layer decreases to a dimensionless thickness less than the boundaries.

Figure 3:
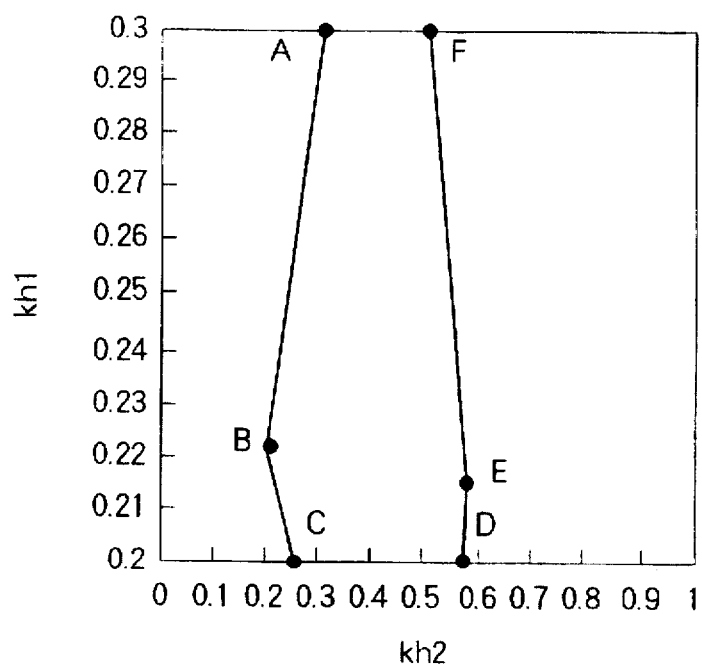
FIG. 3 is a graph in the two-dimensional Cartesian coordinate having abscissa axis of kh1 and ordinate axis of kh2, illustrating the region A-B-C-D-E-F-A providing preferable range of kh1 and kh2 for the first SAW device according to the present invention.

As mentioned before, it is an object of the present invention to provide SAW devices for 0th mode surface acoustic wave, having V of 8,000 to 9,200 (m/s), TCF of −10 to 10 (ppm/°C.), and lower propagation loss than that of SAW devices of aforementioned U.S. Pat. No. 5,446,329 to Nakahata et.al. First, the optimal kh1 and kh2 for kh3=0.047 to 0.0625 satisfying the object were evaluated by using each of the results shown in FIGS. 11 and 13, and FIGS. 12 and 14, respectively. Consequently, it is found that the optimal kh1 and kh2 for providing the preferable V and TCF should be included in a region A-B-C-D-E-F-A shown in FIG. 3, to obtain the first SAW device of the present invention. The propagation loss of the first SAW devices was measured and the results were 0.026 to 0.032 (dB/λ), as shown in TABLE –3.

Figure 4:
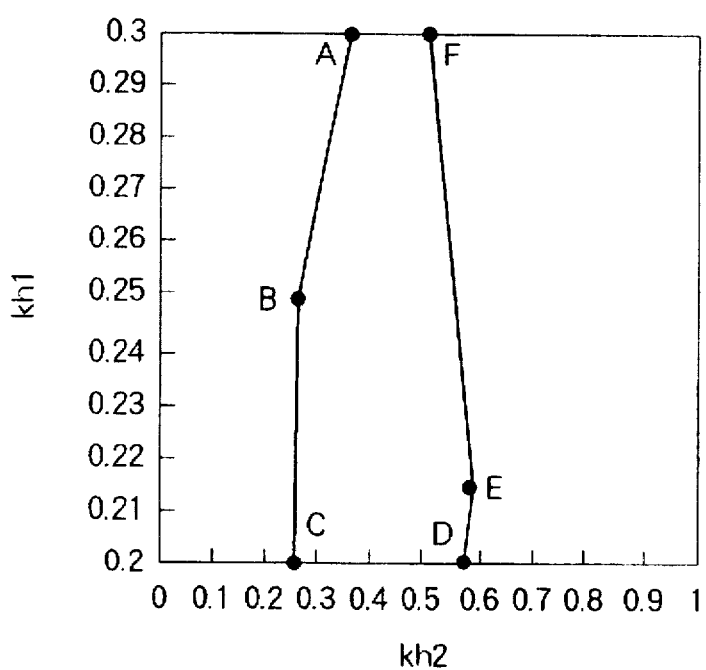
FIG. 4 is a graph in the two-dimensional Cartesian coordinate having abscissa axis of kh1 and ordinate axis of kh2, illustrating the region A-B-C-D-E-F-A providing preferable range of kh1 and kh2 for the second SAW device according to the present invention.

Next, the optimal kh1 and kh2 for kh3=0.0625 to 0.0780 satisfying the above-mentioned object were evaluated by using each of the results shown in FIGS. 13 and 15, and FIGS. 14 and 16, respectively. Consequently, it is found that the optimal kh1 and kh2 for providing the preferable V and TCF should be included in a region A-B-C-D-E-F-A shown in FIG. 4, to obtain the second SAW device of the present invention. The propagation loss of the second SAW devices was measured and the results were 0.028 to 0.032 (dB/λ), as shown in TABLE –4.

TABLE 3

The first SAW device of the present invention:
The SAW devices having dimensionless thickness kh1 and kh2 included in the region A-B-C-D-E-F-A shown in Fig. 3.

| kh1 | kh2 | kh3 | mode of SAW | propagation loss |
|------|------|-------|-----|------------------|
| 0.23 | 0.30 | 0.047 | 0th | 0.026 (dB/λ) |
| 0.25 | 0.40 | 0.050 | 0th | 0.029 |
| 0.25 | 0.50 | 0.047 | 0th | 0.028 |
| 0.28 | 0.40 | 0.050 | 0th | 0.032 |

TABLE 4

The second SAW device of the present invention:
The SAW devices having dimensionless thickness kh1 and kh2 included in the region A-B-C-D-E-F-A shown in Fig. 4.

| kh1 | kh2 | kh3 | mode of SAW | propagation loss |
|------|------|-------|-----|------------------|
| 0.21 | 0.30 | 0.065 | 0th | 0.031 (dB/λ) |
| 0.24 | 0.40 | 0.075 | 0th | 0.028 |
| 0.27 | 0.40 | 0.065 | 0th | 0.030 |
| 0.29 | 0.40 | 0.075 | 0th | 0.032 |

Example 2-2

The second experimental group of SAW devices—(2): optimization of thickness relationship of SAW devices for 1st mode, the third and the fourth SAW devices according to the present invention.

In the second experimental group of SAW devices for utilizing 1st mode SAW, the SAW devices having different thickness of Al IDT 5, as well as different thickness of ZnO and $SiO_2$ layers, were fabricated to determine optimal dimensionless thickness kh3 of Al IDT 5, as well as the dimensionless thickness kh1 and kh2, as conducted in Example 2-1. Similarly as in Example 2-1, optimal ranges of kh1 and kh2 in the case of SAW devices having kh3 of from 0.047 to 0.0780 were determined, for the second experimental group of SAW devices. Similarly as in Example 2-1, it was also found that all the preferable range of kh1 and kh2 corresponding to entire range of kh3 (0.047 to 0.0780) could be covered by obtained three sets of preferable ranges of kh1 and kh2 at kh3=0.047, 0.0625 and 0.0780.

Figure 17:
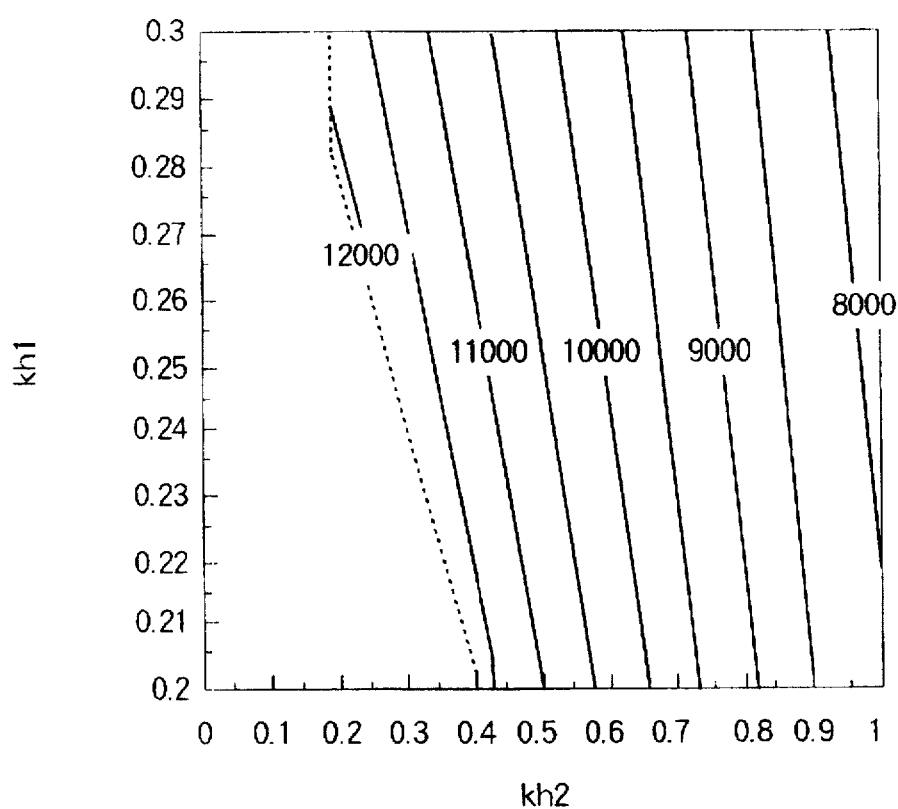
FIG. 17 is a graph showing relationship of parameters kh1 and kh2 of the SAW devices for 1st mode SAW of "the second experimental group" (kh3=0.0470), indicating the variation of the propagation velocity V.
Figure 18:
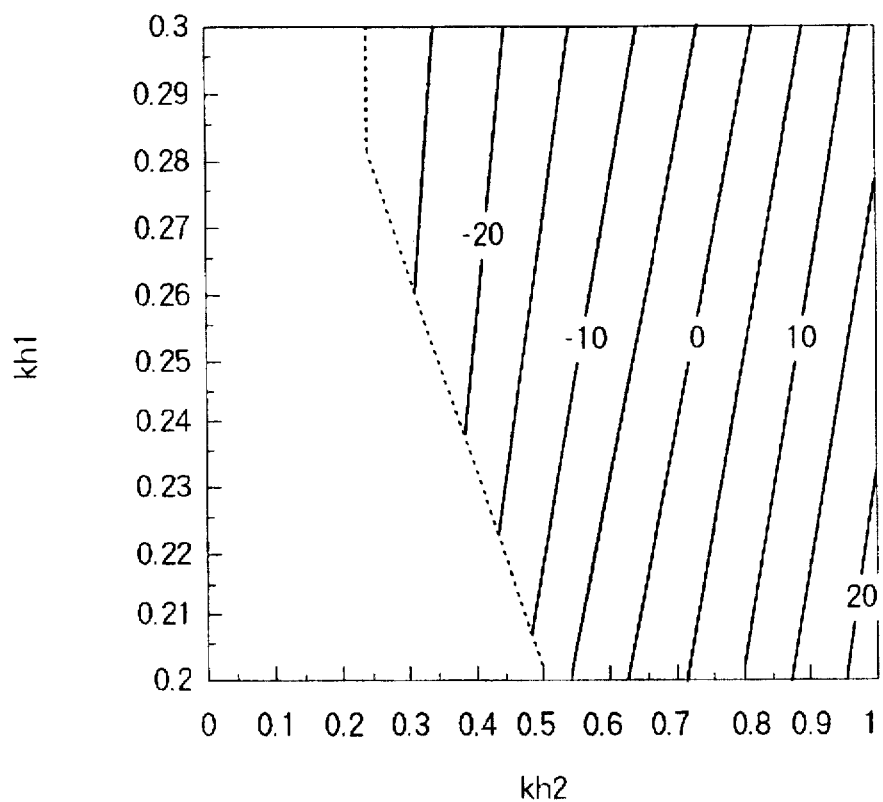
FIG. 18 is a graph showing relationship of parameters kh1 and kh2 of the SAW devices for 1st mode SAW of "the second experimental group" (kh3=0.0470), indicating the variation of the temperature coefficient for frequency TCF.

Variation of the propagation velocity V with the dimensionless thickness of ZnO layer and $SiO_2$ layer are illustrated in FIGS. 17(kh3=0.047), 19(kh3=0.0625) and 21(kh3=0.0780). Variation of the temperature coefficient for frequency TCF with the dimensionless thickness of ZnO layer and $SiO_2$ layer are illustrated in FIGS. 18(kh3=0.047), 20(kh3=0.0625) and 22(kh3=0.0780).

Figure 19:
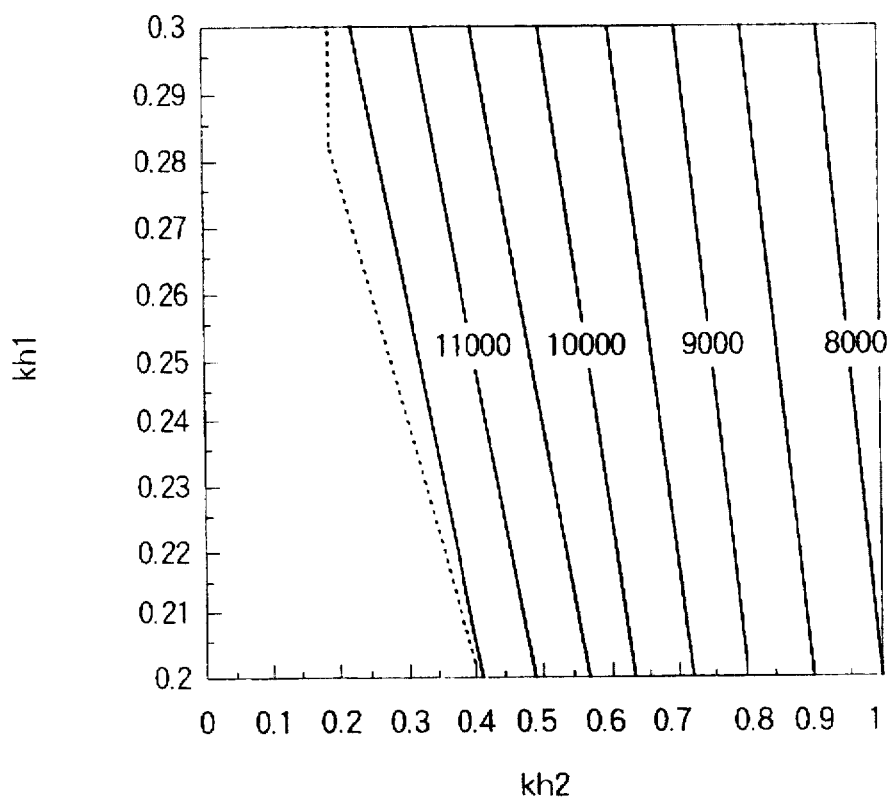
FIG. 19 is a graph showing relationship of parameters kh1 and kh2 of the SAW devices for 1st mode SAW of "the second experimental group" (kh3=0.0625), indicating the variation of the propagation velocity V.
Figure 20:
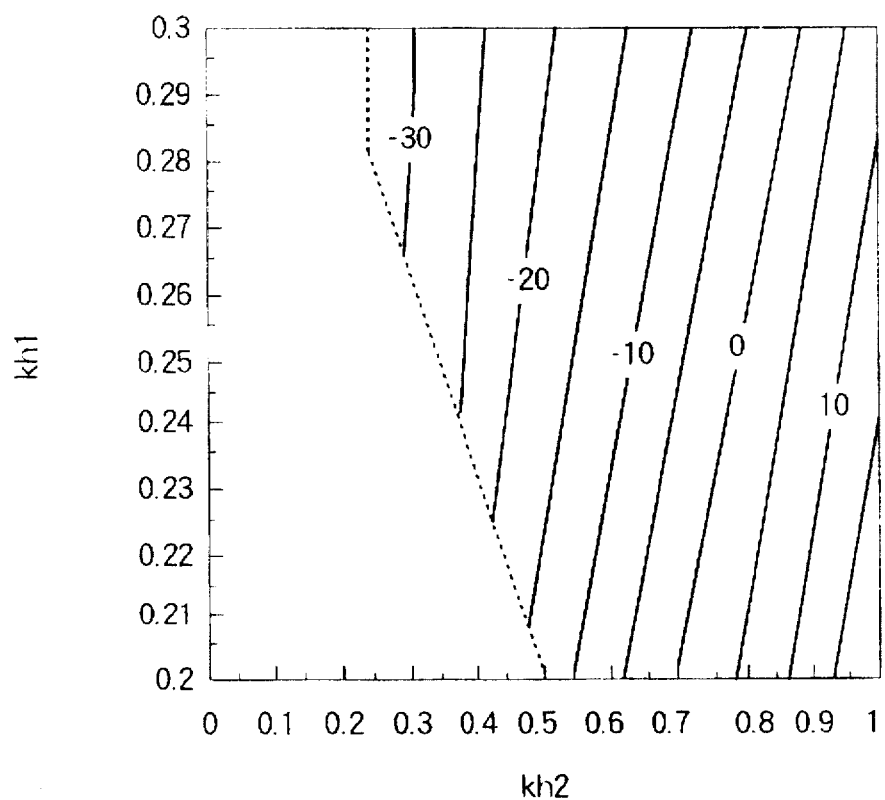
FIG. 20 is a graph showing relationship of parameters kh1 and kh2 of the SAW devices for 1st mode SAW of "the second experimental group" (kh3=0.0625), indicating the variation of the temperature coefficient for frequency TCF.
Figure 21:
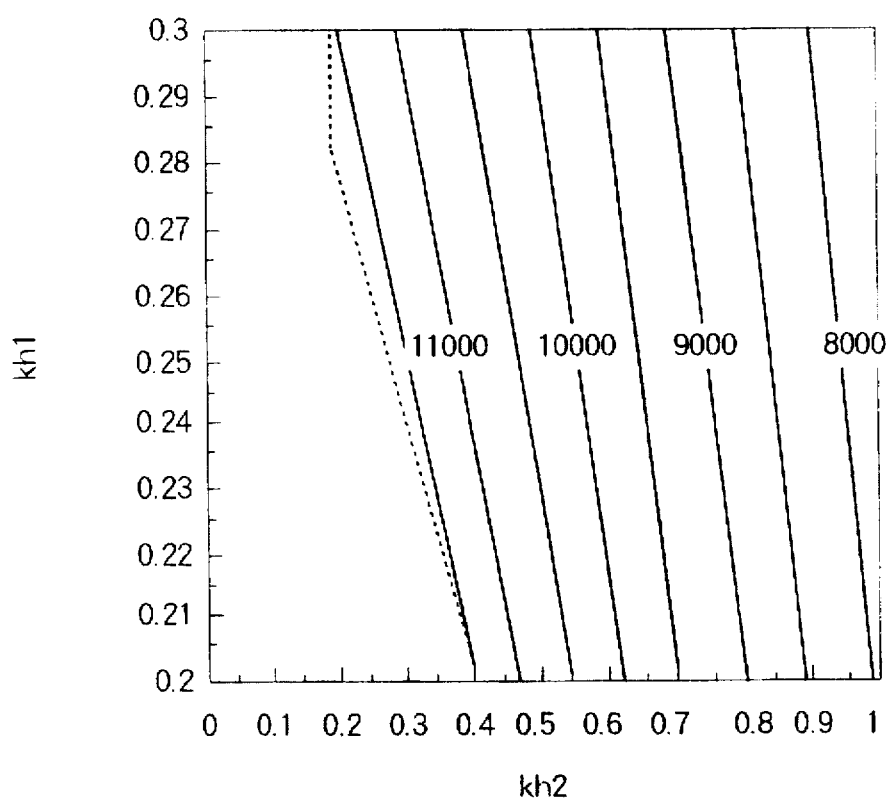
FIG. 21 is a graph showing relationship of parameters kh1 and kh2 of the SAW devices for 1st mode SAW of "experimental group 2" (kh3=0.0780), indicating the variation of the propagation velocity V.
Figure 22:
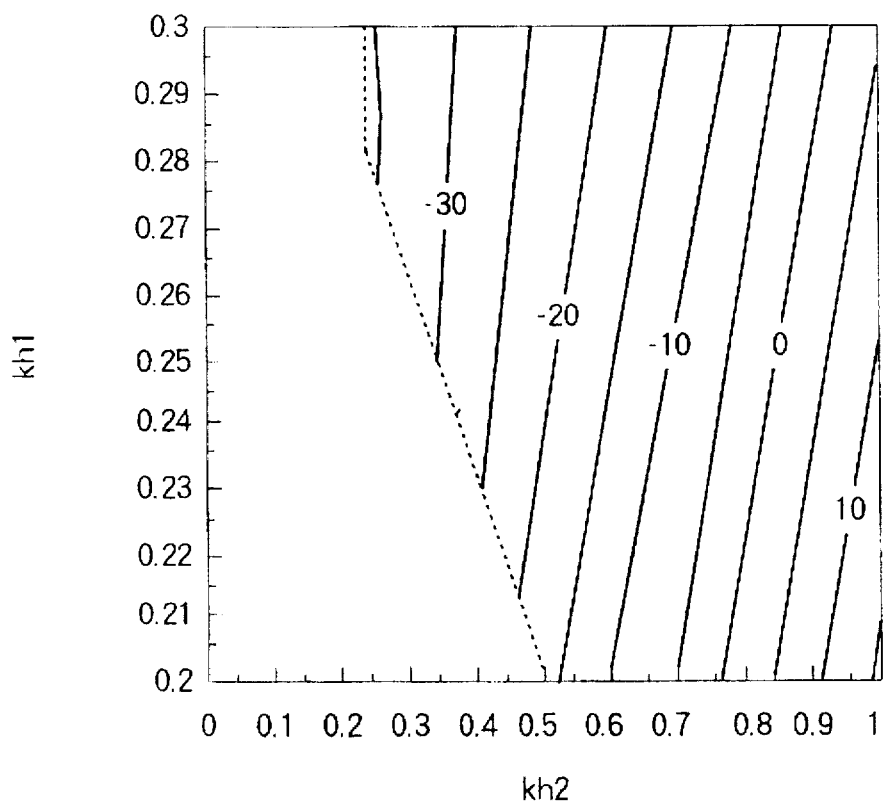
FIG. 22 is a graph showing relationship of parameters kh1 and kh2 of the SAW devices for 1st mode SAW of "the second experimental group" (kh3=0.0780), indicating the variation of the temperature coefficient for frequency TCF.

Similarly as in Example 2-1, all the preferable range of kh1 and kh2 corresponding to range of kh3 (0.047 to 0.0625) could be covered by using each of the obtained two sets of preferable ranges of kh1 and kh2, at kh3=0.047 (FIG. 17) and 0.0625 (FIG. 19), respectively. All the preferable range of kh1 and kh2 for kh3=0.0625 to 0.0780 can also be covered by using each of the obtained two sets of preferable ranges of kh1 and kh2 , at kh3=0.0625 (FIG. 19) and 0.0780 (FIG. 21), respectively. Further, this phenomenon can be applied to the shifting of the TCF-contours with the change of kh3, in which TCF-contours in FIG. 18 are monotonically and continuously shifted through corresponding one in FIG. 20 to corresponding one in FIG. 22, with the change of kh3 from 0.047 through 0.0625 to 0.0780.

Figure 5:
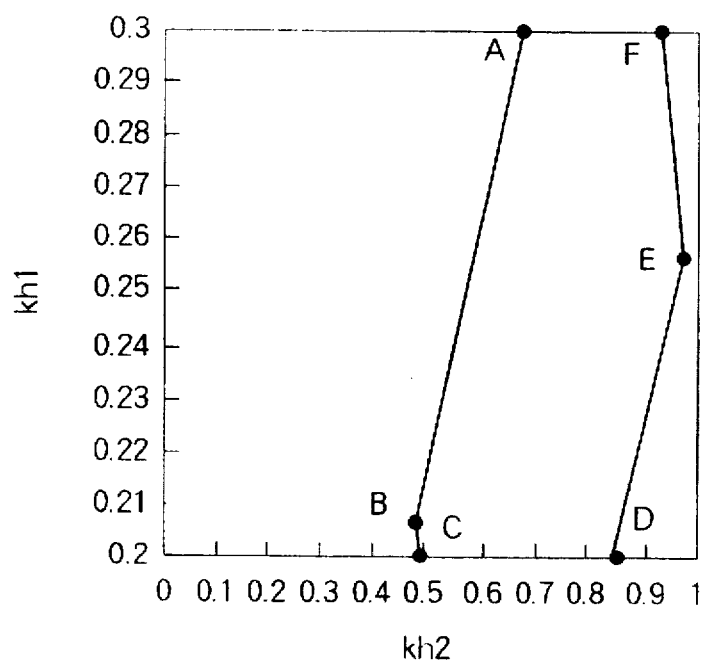
FIG. 5 is a graph in the two-dimensional Cartesian coordinate having abscissa axis of kh1 and ordinate axis of kh2, illustrating the region A-B-C-D-E-F-A providing preferable range of kh1 and kh2 for the third SAW device according to the present invention.

In these FIGS. 17, 18, 19, 20, 21 and 22, dotted lines appearing the left most of the graph indicate the boundaries of the kh2 that the devices would not be form-able as a SAW device when the dimensionless thickness kh2 of $SiO_2$ layer decreases to a dimensionless thickness less than the boundaries. As mentioned before, it is an object of the present invention to provide SAW devices for 1st mode surface acoustic wave, having V of 9,000 to 12,800 (m/s), TCF of −10 to 10 (ppm/°C.), and lower propagation loss than that of SAW devices of aforementioned U.S. Pat. No. 5,446,329 to Nakahata et.al. First, the optimal kh1 and kh2 for kh3=0.047 to 0.0625 satisfying the object were evaluated by using each of the results shown in FIGS. 17 and 19, and FIGS. 18 and 20, respectively. Consequently, it is found that the optimal kh1 and kh2 for providing the preferable V and TCF should be included in a region A-B-C-D-E-F-A shown in FIG. 5, to obtain the third SAW device of the present invention. The propagation loss of the third SAW devices was measured and the results were 0.047 to 0.053 (dB/λ), as shown in TABLE –5.

Figure 6:
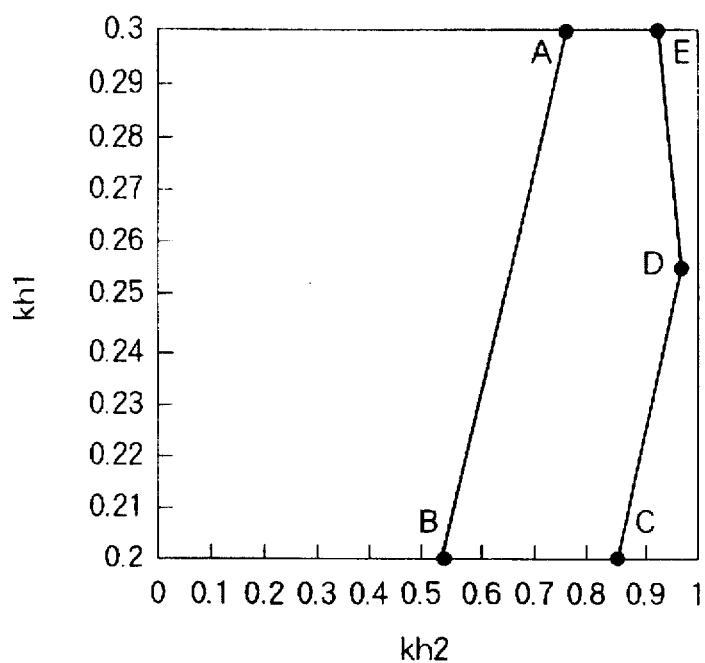
FIG. 6 is a graph in the two-dimensional Cartesian coordinate having abscissa axis of kh1 and ordinate axis of kh2, illustrating the region A-B-C-D-E-A providing preferable range of kh1 and kh2 for the fourth SAW device according to the present invention.

Next, the optimal kh1 and kh2 for kh3=0.0625 to 0.0780 satisfying the above-mentioned object were evaluated by using each of the results shown in FIGS. 19 and 21, and FIGS. 20 and 22, respectively. Consequently, it is found that the optimal kh1 and kh2 for providing the preferable V and TCF should be included in a region A-B-C-D-E-A shown in FIG. 6, to obtain the fourth SAW device of the present invention. The propagation loss of the fourth SAW devices was measured and the results were 0.046 to 0.051 (dB/λ), as shown in TABLE –6.

TABLE 5

The third SAW device of the present invention:
The SAW devices having dimensionless thickness kh1 and kh2 included in the region A-B-C-D-E-F-A shown in Fig. 5.

| kh1 | kh2 | kh3 | mode of SAW | propagation loss |
|------|------|-------|-----|------------------|
| 0.21 | 0.60 | 0.050 | 1st | 0.053 (dB/λ) |
| 0.24 | 0.70 | 0.055 | 1st | 0.049 |
| 0.26 | 0.80 | 0.050 | 1st | 0.047 |
| 0.28 | 0.60 | 0.055 | 1st | 0.048 |

TABLE 6

The fourth SAW device of the present invention:
The SAW devices having dimensionless thickness kh1 and kh2 included in the region A-B-C-D-E-A shown in FIG. 6.

| kh1 | kh2 | kh3 | mode of SAW | propagation loss |
|------|------|-------|-----|------------------|
| 0.22 | 0.65 | 0.065 | 1st | 0.051 (db/λ) |
| 0.24 | 0.70 | 0.070 | 1st | 0.050 |
| 0.26 | 0.80 | 0.065 | 1st | 0.046 |
| 0.28 | 0.70 | 0.070 | 1st | 0.048 |

Comparative Example

The third (comparative) experimental group of SAW devices: measurements of the propagation loss of the SAW device according to U.S. Pat. No. 5,446,329 to Nakahata et.al, for comparison with the SAW device of the present invention.

In order to conduct comparisons of the propagation loss of the SAW devices according to the present invention with that of U.S. Pat. No. 5,446,329 to Nakahata et.al, the third experimental group of SAW devices having the layer constitution shown in FIG. 23 of the present invention and having a constitution satisfying the relationship of kh1 (kh of ZnO) and kh2 (kh of $SiO_2$) surrounded by 4 circles in FIG. 15 of U.S. Pat. No. 5,446,329 (14th column, lines 18 to 19), were produced.

In this comparative Example, propagation loss was also evaluated by the same manner as in Examples 1-1 to 2-2: SAW devices having same layer/electrode constitution but different spacing between input IDT and output IDT (e.g., 50 wavelength, 100 wavelength and 150 wave length) were fabricated. A relationship of insertion loss with the spacing was evaluated and found that the insertion loss was proportional to the spacing. Then the propagation loss could be obtained by the slope of the relationship.

The obtained propagation losses in the comparative example were 0.051 to 0.053 (dB/λ) for 0th mode SAW, as shown in TABLE −7, which were higher than that of SAW devices according to the present invention shown in TABLES 1, 3 and 4. Also, for 1st mode SAW, the obtained propagation losses were 0.079 to 0.083 (dB/λ), as shown in TABLE −7, which were higher than that of SAW devices according to the present invention shown in TABLES 1, 3 and 4.

Therefore, it was demonstrated that the SAW devices according to the present invention have excellent propagation loss, as well as propagation velocity V and temperature coefficient TCF.

TABLE 7

Comparative Example.
The SAW device according to U.S. Pat. No. 5,446,329 to Nakahata et. al, having layer constitution shown in Fig. 23 of the present invention, and having dimensionless thickness kh1 and kh2 included in the region surrounded by 4 circles shown in Fig. 15 of U.S. Pat. No. 5,446,329.

| kh1 | kh2 | mode of SAW | propagation loss |
|-----|-----|-------------|------------------|
| 0.50 | 0.45 | 0th | 0.053 (dB/λ) |
| 0.50 | 0.45 | 1st | 0.079 |
| 0.70 | 0.40 | 0th | 0.051 |
| 0.70 | 0.40 | 1st | 0.083 |

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No.7-276,260 (276,260/1995) filed on Sep. 29, 1995 is hereby incorporated by reference.

What is claimed is:

1. A surface acoustic wave device comprising:

(i) a diamond layer;

(ii) an aluminum (Al) interdigital transducer (IDT) formed on said diamond layer, said Al IDT having a thickness of t3;

(iii) a polycrystalline c-axis oriented ZnO layer formed over said Al IDT and on said diamond layer, said ZnO layer having a thickness of t1; and (iv) a $SiO_2$ layer formed on said ZnO layer, said $SiO_2$ layer having a thickness of t2, wherein, for 0th mode surface acoustic wave having a wavelength λ, a parameter kh3=$(2\pi/\lambda)$t3 satisfies: 0.0470≦kh3≦0.0625, and wherein a parameter kh1=$(2\pi/\lambda)$t1 and a parameter kh2=$(2\pi/\lambda)$t2 are given within a region A-B-C-D-E-F-A in a two-dimensional Cartesian coordinate graph having ordinate axis of kh1 and abscissa axis of kh2, the outer edge of said region A-B-C-D-E-F-A being given by a closed chain in said Cartesian coordinate, consisting of points A, B, C, D, E, and F, and lines A–B, B–C, C–D, D–E, E–F and F–A, said point A being given by a coordinate point (kh2=0.280, kh1=0.300);

said point B being given by a coordinate point (kh2=0.200, kh1=0.221);

said point C being given by a coordinate point (kh2=0.250, kh1=0.200);

said point D being given by a coordinate point (kh2=0.570, kh1=0.200);

said point E being given by a coordinate point (kh2=0.575, kh1=0.214); and said point F being given by a coordinate point (kh2=0.475, kh1=0.300 ).

2. A surface acoustic wave device comprising:

(i) a diamond layer;

(ii) an aluminum (Al) interdigital transducer (IDT) formed on said diamond layer, said Al IDT having a thickness of t3;

(iii) a polycrystalline c-axis oriented ZnO layer formed over said Al IDT and on said diamond layer, said ZnO layer having a thickness of t1; and (iv) a $SiO_2$ layer formed on said ZnO layer, said $SiO_2$ layer having a thickness of t2, wherein, for 0th mode surface acoustic wave having a wavelength λ, a parameter kh3=$(2\pi/\lambda)$t3 satisfies: 0.0625≦kh3≦0.0780, and wherein a parameter kh1=$(2\pi/\lambda)$t1 and a parameter kh2=$(2\pi/\lambda)$t2 are given within a region A-B-C-D-E-F-A in a two-dimensional Cartesian coordinate graph having ordinate axis of the kh1 and abscissa axis of kh2, the outer edge of said region A-B-C-D-E-F-A being given by a closed chain in said Cartesian coordinate, consisting of points A, B, C, D, E, and F, and lines A–B, B–C, C–D, D–E, E–F and F–A, said point A being given by a coordinate point (kh2=0.330, kh1=0.300);

said point B being given by a coordinate point (kh2=0.245, kh1=0.250);

said point C being given by a coordinate point (kh2=0.250, kh1=0.200);

said point D being given by a coordinate point (kh2=0.575, kh1=0.200);

said point E being given by a coordinate point (kh2=0.580, kh1=0.214); and said point F being given by a coordinate point (kh2=0.475, kh1=0.300).

3. A surface acoustic wave device comprising:

(i) a diamond layer;

(ii) an aluminum (Al) interdigital transducer (IDT) formed on said diamond layer, said Al IDT having a thickness of t3;

(iii) a polycrystalline c-axis oriented ZnO layer formed over said Al IDT and on said diamond layer, said ZnO layer having a thickness of t1; and (iv) a $SiO_2$ layer formed on said ZnO layer, said $SiO_2$ layer having a thickness of t2, wherein, for 1st mode surface acoustic wave having a wavelength $\lambda$, a parameter $kh3=(2\pi/\lambda)t3$ satisfies: $0.0470 \leq kh3 \leq 0.0625$, and wherein a parameter $kh1=(2\pi/\lambda)t1$ and a parameter $kh2=(2\pi/\lambda)t2$ are given within a region A-B-C-D-E-F-A in a two-dimensional Cartesian coordinate graph having ordinate axis of the kh1 and abscissa axis of kh2, the outer edge of said region A-B-C-D-E-F-A being given by a closed chain in said Cartesian coordinate, consisting of points A, B, C, D, E, and F, and lines A–B, B–C, C–D, D–E, E–F and F–A, said point A being given by a coordinate point (kh2=0.650, kh1=0.300);

said point B being given by a coordinate point (kh2=0.480, kh1=0.206);

said point C being given by a coordinate point (kh2=0.490, kh1=0.200);

said point D being given by a coordinate point (kh2=0.850, kh1=0.200);

said point E being given by a coordinate point (kh2=0.955, kh1=0.256); and said point F being given by a coordinate point (kh2=0.900, kh1=0.300).

4. A surface acoustic wave device comprising:

(i) a diamond layer;

(ii) an aluminum (Al) interdigital transducer (IDT) formed on said diamond layer, said Al IDT having a thickness of t3;

(iii) a polycrystalline c-axis oriented ZnO layer formed over said Al IDT and on said diamond layer, said ZnO layer having a thickness of t1; and (iv) a $SiO_2$ layer formed on said ZnO layer, said $SiO_2$ layer having a thickness of t2, wherein, for 1st mode surface acoustic wave having a wavelength $\lambda$, a parameter $kh3=(2\pi/\lambda)t3$ satisfies: $0.0625 \leq kh3 \leq 0.0780$, and wherein a parameter $kh1=(2\pi/\lambda)t1$ and a parameter $kh2=(2\pi/\lambda)t2$ are given within a region A-B-C-D-E-A in a two-dimensional Cartesian coordinate graph having ordinate axis of the kh1 and abscissa axis of kh2, the outer edge of said region A-B-C-D-E-A being given by a closed chain in the Cartesian coordinate, consisting of points A, B, C, D, and E, and lines A–B, B–C, C–D, D–E, and E–A, said point A being given by a coordinate point (kh2=0.730, kh1=0.300);

said point B being given by a coordinate point (kh2=0.530, kh1=0.200);

said point C being given by a coordinate point (kh2=0.850, kh1=0.200);

said point D being given by a coordinate point (kh2=0.955, kh1=0.256); and said point E being given by a coordinate point (kh2=0.900, kh1=0.300).

* * * * *